(12) United States Patent
Ng et al.

(10) Patent No.: US 8,385,043 B2
(45) Date of Patent: *Feb. 26, 2013

(54) GALVANIC ISOLATOR

(75) Inventors: Gek Yong Ng, Singapore (SG); Richard A. Baumgartner, Palo Alto, CA (US); Julie E. Fouquet, Portola Valley, CA (US)

(73) Assignee: Avago Technologies ECBU IP (Singapoare) Pte. Ltd., Singapore (SG)

( * ) Notice: Subject to any disclaimer, the term of this patent is extended or adjusted under 35 U.S.C. 154(b) by 719 days.

This patent is subject to a terminal disclaimer.

(21) Appl. No.: 12/477,078

(22) Filed: Jun. 2, 2009

(65) Prior Publication Data
US 2010/0020448 A1    Jan. 28, 2010

Related U.S. Application Data

(63) Continuation-in-part of application No. 12/059,979, filed on Mar. 31, 2008, and a continuation-in-part of application No. 11/512,034, filed on Aug. 28, 2006, now Pat. No. 7,791,900, and a continuation-in-part of application No. 11/747,092, filed on May 10, (Continued)

(51) Int. Cl.
*H01H 9/00* (2006.01)
(52) U.S. Cl. .................................................. 361/268
(58) Field of Classification Search ............... 361/268
See application file for complete search history.

(56) References Cited

U.S. PATENT DOCUMENTS

| | | |
|---|---|---|
| 4,027,152 A | 5/1977 | Brown et al. |
| 4,236,086 A | 11/1980 | Hoebel |
| 4,494,100 A | 1/1985 | Stengel et al. |
| 4,541,894 A | 9/1985 | Cassat |
| 4,931,075 A | 6/1990 | Kuhn |
| 5,015,972 A | 5/1991 | Cygan et al. |
| 5,070,317 A | 12/1991 | Bhagat |
| 5,312,674 A | 5/1994 | Haertling et al. |
| 5,363,081 A | 11/1994 | Bando et al. |
| 5,420,558 A | 5/1995 | Ito et al. |
| 5,504,668 A | 4/1996 | Beyerlein |

(Continued)

FOREIGN PATENT DOCUMENTS

| | | |
|---|---|---|
| CN | 1180277 | 4/1998 |
| CN | 1237081 | 12/1999 |

(Continued)

OTHER PUBLICATIONS

U.S. Appl. No. 11/264,956, filed Nov. 1, 2005, Guenin et al.

(Continued)

*Primary Examiner* — Stephen W Jackson

(57) ABSTRACT

Galvanic isolators are disclosed herein. An embodiment of a galvanic isolator comprises a generally planar electrically insulating substrate comprising opposing first and second surfaces, the substrate comprising an electrically insulating, low dielectric loss material and having a transmitter coil disposed on the first surface and a receiving coil disposed on the second surface. A transmitter circuit is operably connected to the transmitter coil. The transmitter circuit comprises a first detector that detects a rising edge of an input signal; a first pulse generator that generates a plurality of first pulses upon detection of the rising edge; a second detector that detects a falling edge of the input signal; and a second pulse generator that generates a plurality of second pulses upon detection of the falling edge. A receiver circuit is operably connected to the second receiving coil. The receiver circuit generates a signal that is substantially similar to the input signal based on the first pulses and the second pulses.

22 Claims, 24 Drawing Sheets

Related U.S. Application Data 2007, now abandoned, and a continuation-in-part of application No. 12/392,978, filed on Feb. 25, 2009, and a continuation-in-part of application No. 12/059,747, filed on Mar. 31, 2008, and a continuation-in-part of application No. 12/370,208, filed on Feb. 12, 2009, and a continuation-in-part of application No. 12/393,596, filed on Feb. 26, 2009.

(56) References Cited

U.S. PATENT DOCUMENTS

| | | | |
|---|---|---|---|
| 5,597,979 | A | 1/1997 | Courtney et al. |
| 5,659,462 | A | 8/1997 | Chen et al. |
| 5,693,971 | A | 12/1997 | Gonzalez |
| 5,716,713 | A | 2/1998 | Zsamboky et al. |
| 5,754,088 | A | 5/1998 | Fletcher et al. |
| 5,768,111 | A | 6/1998 | Zaitsu |
| 5,825,259 | A | 10/1998 | Harpham |
| 5,952,849 | A | 9/1999 | Haigh |
| 6,167,475 | A | 12/2000 | Carr |
| 6,175,293 | B1 | 1/2001 | Hasegawa et al. |
| 6,198,374 | B1 | 3/2001 | Abel |
| 6,215,377 | B1 | 4/2001 | Douriet et al. |
| 6,255,714 | B1 | 7/2001 | Kossives et al. |
| 6,300,617 | B1 | 10/2001 | Daughton |
| 6,307,457 | B1 | 10/2001 | Wissink et al. |
| 6,320,532 | B1 | 11/2001 | Diede |
| 6,404,317 | B1 | 6/2002 | Mizoguchi et al. |
| 6,476,704 | B2 | 11/2002 | Goff |
| 6,489,850 | B2 | 12/2002 | Heineke et al. |
| 6,501,364 | B1 | 12/2002 | Hui et al. |
| 6,525,566 | B2 | 2/2003 | Haigh et al. |
| 6,538,313 | B1 | 3/2003 | Smith |
| 6,545,059 | B1 | 4/2003 | Fichou |
| 6,556,117 | B1 | 4/2003 | Nakao et al. |
| 6,574,091 | B2 | 6/2003 | Heineke et al. |
| 6,661,079 | B1 | 12/2003 | Bikulcius et al. |
| 6,686,825 | B2 | 2/2004 | Tamezawa et al. |
| 6,856,226 | B2 | 2/2005 | Gardner |
| 6,859,130 | B2 | 2/2005 | Nakashima et al. |
| 6,867,678 | B2 | 3/2005 | Yang |
| 6,870,456 | B2 | 3/2005 | Gardner |
| 6,873,065 | B2 | 3/2005 | Haigh et al. |
| 6,888,438 | B2 | 5/2005 | Hui et al. |
| 6,891,461 | B2 | 5/2005 | Gardner |
| 6,903,578 | B2 | 6/2005 | Haigh et al. |
| 6,919,775 | B2 | 7/2005 | Wendt et al. |
| 6,922,080 | B2 | 7/2005 | Haigh et al. |
| 6,943,658 | B2 | 9/2005 | Gardner |
| 6,944,009 | B2 | 9/2005 | Nguyen et al. |
| 6,970,040 | B1 | 11/2005 | Dening |
| 7,016,490 | B2 | 3/2006 | Beutler et al. |
| 7,064,442 | B1 | 6/2006 | Lane et al. |
| 7,170,807 | B2 | 1/2007 | Franzen et al. |
| 7,171,739 | B2 | 2/2007 | Yang et al. |
| 7,302,247 | B2 | 11/2007 | Dupuis |
| 7,376,116 | B2 | 5/2008 | Rozenblitz et al. |
| 7,376,212 | B2 | 5/2008 | Dupuis |
| 7,421,028 | B2 | 9/2008 | Dupuis |
| 7,425,787 | B2 | 9/2008 | Larson, III |
| 7,436,282 | B2 | 10/2008 | Whittaker et al. |
| 7,447,492 | B2 | 11/2008 | Dupuis |
| 7,460,604 | B2 | 12/2008 | Dupuis |
| 7,545,059 | B2 | 6/2009 | Chen |
| 7,577,223 | B2 | 8/2009 | Alfano |
| 7,650,130 | B2 | 1/2010 | Dupuis |
| 7,683,654 | B2 | 3/2010 | Chen |
| 7,692,444 | B2 | 4/2010 | Chen |
| 7,719,305 | B2 | 5/2010 | Chen |
| 7,737,871 | B2 | 6/2010 | Leung et al. |
| 7,738,568 | B2 | 6/2010 | Alfano |
| 7,741,943 | B2 * | 6/2010 | Fouquet et al. ............... 336/200 |
| 7,746,943 | B2 | 6/2010 | Yamaura |
| 7,821,428 | B2 | 10/2010 | Laung |
| 7,856,219 | B2 | 12/2010 | Dupuis |
| 7,920,010 | B2 | 4/2011 | Chen |
| 7,932,799 | B2 | 4/2011 | Loef et al. |
| 7,948,067 | B2 * | 5/2011 | Fouquet et al. ............... 257/666 |
| 8,049,573 | B2 | 11/2011 | Alfano |
| 8,061,017 | B2 * | 11/2011 | Fouquet et al. ............... 29/606 |
| 8,064,872 | B2 | 11/2011 | Dupuis |
| 8,093,983 | B2 | 1/2012 | Fouquet |
| 2002/0075116 | A1 | 6/2002 | Peels et al. |
| 2002/0110013 | A1 | 8/2002 | Park et al. |
| 2002/0135236 | A1 | 9/2002 | Haigh |
| 2003/0042571 | A1 | 3/2003 | Chen et al. |
| 2004/0056749 | A1 | 3/2004 | Kahlmann et al. |
| 2005/0003199 | A1 | 1/2005 | Takaya et al. |
| 2005/0057277 | A1 | 3/2005 | Chen et al. |
| 2005/0077993 | A1 | 4/2005 | Kanno et al. |
| 2005/0094302 | A1 | 5/2005 | Matsuzaki et al. |
| 2005/0128038 | A1 | 6/2005 | Hyvonen |
| 2005/0133249 | A1 | 6/2005 | Fujii |
| 2005/0269657 | A1 | 12/2005 | Dupuis |
| 2005/0272378 | A1 | 12/2005 | Dupuis |
| 2006/0028313 | A1 | 2/2006 | Strzalkowski et al. |
| 2006/0095639 | A1 | 5/2006 | Guenin et al. |
| 2006/0152322 | A1 | 7/2006 | Whittaker et al. |
| 2006/0170527 | A1 | 8/2006 | Braunisch |
| 2006/0176137 | A1 | 8/2006 | Sato et al. |
| 2006/0214759 | A1 | 9/2006 | Kawaraj |
| 2006/0220775 | A1 | 10/2006 | Ishikawa |
| 2007/0080587 | A1 | 4/2007 | Ruizenaar et al. |
| 2007/0085447 | A1 | 4/2007 | Larson, III |
| 2007/0085632 | A1 | 4/2007 | Larson, III et al. |
| 2007/0086274 | A1 | 4/2007 | Nishimura et al. |
| 2007/0133923 | A1 | 6/2007 | Han et al. |
| 2007/0281394 | A1 | 12/2007 | Kawabe et al. |
| 2007/0290788 | A1 | 12/2007 | Nesse et al. |
| 2008/0007382 | A1 | 1/2008 | Snyder |
| 2008/0031286 | A1 | 2/2008 | Alfano et al. |
| 2008/0051158 | A1 | 2/2008 | Male et al. |
| 2008/0061631 | A1 | 3/2008 | Fouquet et al. |
| 2008/0174396 | A1 | 7/2008 | Choi et al. |
| 2008/0176362 | A1 | 7/2008 | Sengupta et al. |
| 2008/0179963 | A1 | 7/2008 | Fouquet et al. |
| 2008/0180206 | A1 | 7/2008 | Fouquet |
| 2008/0198904 | A1 | 8/2008 | Chang |
| 2008/0278275 | A1 | 11/2008 | Fouquet |
| 2008/0284552 | A1 | 11/2008 | Lim et al. |
| 2008/0308817 | A1 | 12/2008 | Wang et al. |
| 2008/0311862 | A1 | 12/2008 | Spina |
| 2009/0072819 | A1 | 3/2009 | Takahashi |
| 2009/0180403 | A1 | 7/2009 | Tudosoiu |
| 2009/0243782 | A1 | 10/2009 | Fouquet et al. |
| 2009/0243783 | A1 | 10/2009 | Fouquet et al. |
| 2009/0268486 | A1 | 10/2009 | Ljusev et al. |
| 2010/0020448 | A1 | 1/2010 | Ng et al. |
| 2010/0052120 | A1 | 3/2010 | Pruitt |
| 2010/0176660 | A1 | 7/2010 | Fouquet |
| 2010/0188182 | A1 | 7/2010 | Fouquet et al. |
| 2010/0259909 | A1 | 10/2010 | Ho et al. |
| 2010/0328902 | A1 | 12/2010 | Ho et al. |
| 2011/0075449 | A1 | 3/2011 | Fouquet |
| 2011/0095620 | A1 | 4/2011 | Fouquet |

FOREIGN PATENT DOCUMENTS

| | | |
|---|---|---|
| DE | 19911133 | 10/2000 |
| DE | 10154906 | 5/2003 |
| EP | 1309033 | 5/2003 |
| EP | 1617337 | 1/2006 |
| GB | 2403072 | 6/2004 |
| JP | 57-39598 | 3/1982 |
| JP | 61-59714 | 3/1986 |
| JP | 3171705 | 7/1991 |
| JP | 06-53052 | 2/1994 |
| JP | 8-241955 | 9/1996 |
| JP | 2000-508116 | 6/2000 |
| JP | 2003-151829 | 5/2003 |
| JP | 2005-513824 | 5/2005 |
| JP | 2008-61236 | 3/2008 |
| WO | WO-9734349 | 3/1997 |

| | | |
|---|---|---|
| WO | WO-2005/001928 | 6/2005 |
| WO | WO-2006033071 | 3/2006 |
| WO | WO-2007/053379 | 5/2007 |

OTHER PUBLICATIONS

U.S. Appl. No. 11/512,034, filed Aug. 28, 2006, Fouquet et al.

U.S. Appl. No. 11/747,092, filed May 10, 2007, Fouquet et al.

"Texas Instruments Dual Digital Isolators", SLLS755E Jul. 2007.

Allflex Flexible Printed Circuit,, "Design Guide", <http://www.allflexinc.com> Retreived Feb. 12, 2009.

Analog Devices, "iCoupler R Digital Isolation Products", 2005.

Analog Devices, Inc., "iCoupler Digital Isolator ADuM1100 Data Sheet,", Rev F 2006.

Avago Technologies, "ACCL-9xxx 3.3V/5V High Speed CMOS Capacitive Isolator", Preliminary Datasheet. 2005.

Chen, Baoxing et al., "High Speed Digital Isolators Using Microscale On-Chip Transformers", Jul. 22, 2003.

Chen, Baoxing, "iCoupler Products with iso Power Technology", *"Singal and Power Transfer Across Isolation Barrier Using Microtransformers" Analog Devices* 2006.

Electronic Design, "Planar Transformers make Maximum Use of Precious Board Space", *Penton Media, Inc.*, ED Online ID #7647 Mar. 9, 1998.

Fiercewireless,, "Skyworks Introduces Industry's First Multi-band, Multi-mode TDD/TDD Power Amplifier for 4G LTE Applications Next-Generation TEC", Dec. 18, 2008, 6 pages.

Kliger, R., "Integrated Transformer-Coupled Isolation", Mar. 2003.

Krupka, J. et al., "Measurements of Permittivity, Loss Dielectric Tangent, and Resistivity of Float-Zone Silicon at Microwave Frequencies", *IEEE Abstract Microwave Theory and Techniques, IEEE Transaction* on vol. 54, Issue 11 Nov. 2006, 3995-4001.

Myers, John et al., "GMR Isolators", *Nonvalatile Electronics, Inc.* 1998.

Payton Group International, "Off the Shelf SMT Planar Transformers", <http://www.paytongroup.com> Retreived Mar. 31, 2008.

Rogers Corporation,, "Advanced Circuit Materials, High Frequency Laminates and Flexible Circuit Materials", <http://www.rogerscorporation.com/mwu/translations/prod.htm> Mar. 2008.

Smith, Carl H. et al., "Chip-Size Magnetic Sensor Arrays", May 21, 2002.

Yang, Ru-Yuan, "Loss Characteristics of Silicon Substrate with Different Resistivities", *Microwave and Optical Technology Letters*, vol. 48, No. 9 Sep. 2006.

Miroslav Oljaca, Interfacing the ADS1202 Modulator With A Pulse Transformer In Galvanically Isolated Systems, SBAA096—Jun. 2003, 22 pages.

Biersach,, "Designing Medical Electrical Equipment to Meet Safety Certification And Regulatory Requirements", *Underwriters Laboratories*, 6 pages, Table 2 Jan. 2002.

Doane, et al., "Multichip Module Technologies And Alternatives—The Basics", Section 5.3.2. 1993, 185.

\* cited by examiner

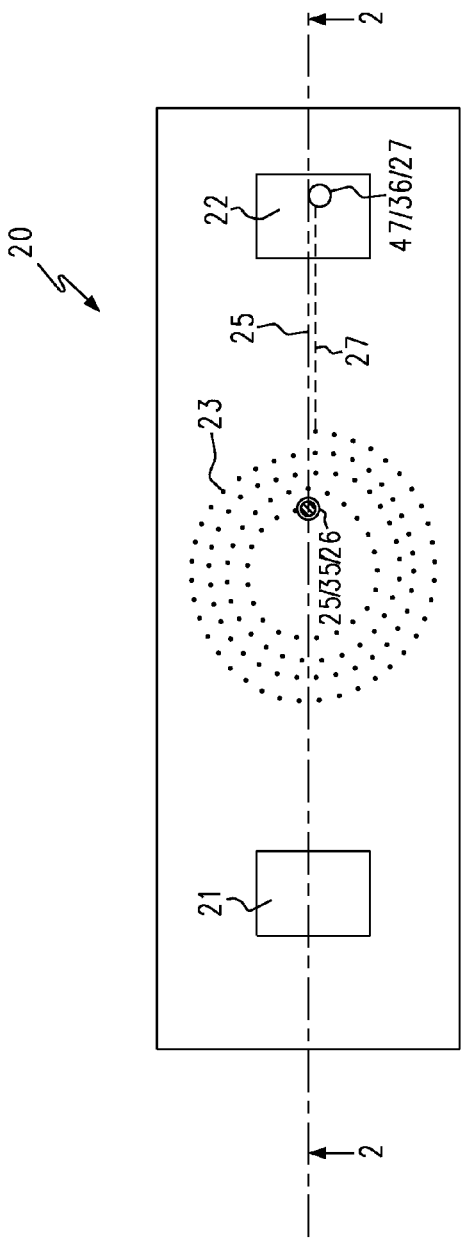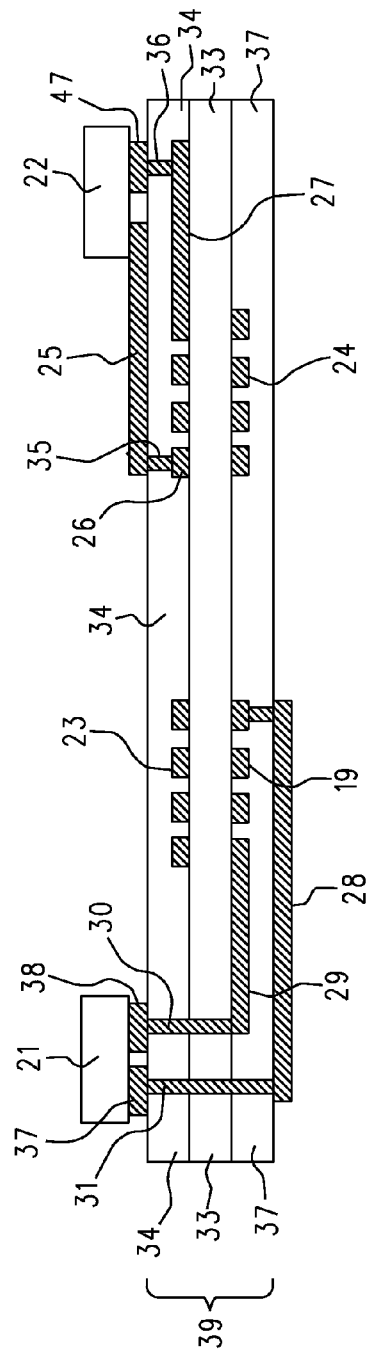

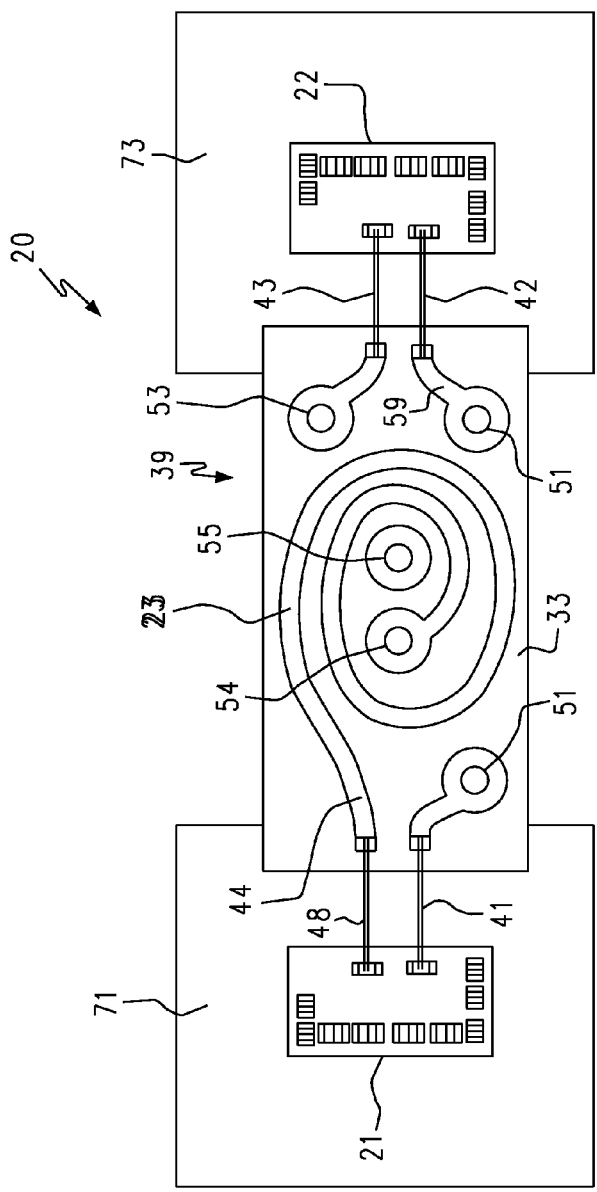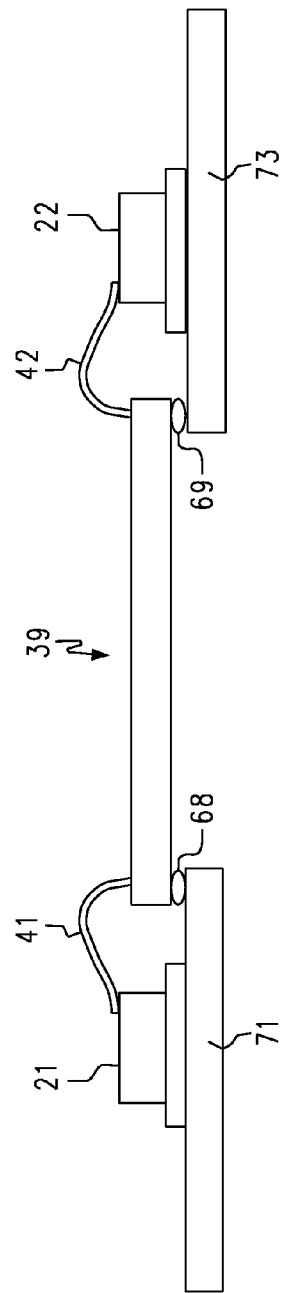

GALVANIC ISOLATOR

RELATED APPLICATIONS

This application claims priority and other benefits from, and is a continuation-in-part, of each of the following patent applications: (a) U.S. patent application Ser. No. 12/059,979 filed Mar. 31, 2008 entitled "Galvanic Isolators and Coil Transducers" to Fouquet et al.; (b) U.S. patent application Ser. No. 11/512,034 filed Aug. 28, 2006 now U.S. Pat. No. 7,791,900 entitled "Galvanic Isolator" to Fouquet et al.; (c) U.S. patent application Ser. No. 11/747,092 filed May 10, 2007 now abandoned entitled "Miniature Transformers Adapted for Use in Galvanic Isolators and the Like" to Fouquet et al.; (d) U.S. patent application Ser. No. 12/392,978 filed Feb. 25, 2009 entitled "Miniature Transformers Adapted for Use in Galvanic Isolators and the Like" to Fouquet et al.; (e) U.S. patent application Ser. No. 12/059,747 filed Mar. 31, 2008 entitled "Coil Transducer with Reduced Arcing and Improved High Voltage Breakdown Characteristics" to Fouquet et al.: (f) U.S. patent application Ser. No. 12/370,208 filed Feb. 12, 2009 entitled "High Voltage Hold-Off Coil Transducer" to Fouquet et al.; and (g) U.S. patent application Ser. No. 12/393,596 filed Feb. 26, 2009 entitled "Minimizing Electromagnetic Interference in Coil Transducers" to Fouquet et al. This application also hereby incorporates by reference, in its entirety, U.S. patent application Ser. No. 12/059,747 filed Mar. 31, 2008 entitled "Coil Transducer with Reduced Arcing and Improved High Voltage Breakdown Characteristics" to Fouquet et al.

BACKGROUND

High voltage isolation communication devices known in the prior art include optical devices, magnetic devices and capacitive devices. Prior art optical devices typically achieve high voltage isolation by employing LEDs and corresponding photodiodes to transmit and receive light signals, usually require high power levels, and suffer from operational and design constraints when multiple communication channels are required.

Prior art magnetic devices typically achieve high voltage isolation by employing opposing inductively-coupled coils, usually require high power levels (especially when high data rates are required), typically require the use of at least three separate integrated circuits or chips, and often are susceptible to electromagnetic interference ("EMI").

Prior art capacitive devices achieve voltage isolation by employing multiple pairs of transmitting and receiving electrodes, where for example a first pair of electrodes is employed to transmit and receive data, and a second pair of electrodes is employed to refresh or maintain the transmitted signals. Such capacitive devices typically exhibit poor high voltage hold-off or breakdown characteristics The design of small high speed galvanic isolators presents several formidable technical challenges, such as how to handle electromagnetic interference (EMI), large-magnitude fast transients, and other forms of electrical noise while maintaining high voltage breakdown characteristics, and acceptable data or power transfer rates.

What is needed is a high voltage isolation communication device that is small, consumes reduced power, permits data to be communicated at relatively high data rates, has improved high voltage breakdown capabilities, that may be built at lower cost, or that has other advantages that will become apparent after having read and understood the specification and drawings hereof.

SUMMARY

Galvanic isolators are disclosed herein. An embodiment of a galvanic isolator comprises a generally planar electrically insulating substrate comprising opposing first and second surfaces, the substrate comprising an electrically insulating, low dielectric loss material and having a transmitter coil disposed on the first surface and a receiving coil disposed on the second surface. A transmitter circuit is operably connected to the transmitter coil. The transmitter circuit comprises a first detector that detects a rising edge of an input signal; a first pulse generator that generates a plurality of first pulses upon detection of the rising edge; a second detector that detects a falling edge of the input signal; and a second pulse generator that generates a plurality of second pulses upon detection of the falling edge. A receiver circuit is operably connected to the second receiving coil. The receiver circuit generates a signal that is substantially similar to the input signal based on the first pulses and the second pulses.

BRIEF DESCRIPTION OF THE DRAWINGS

Different aspects of the various embodiments of the invention will become apparent from the following specification, drawings and claims in which:

FIGS. 1 and 2 illustrate an embodiment of a galvanic isolator.

FIG. 9 and FIG. 10 illustrate an embodiment of a galvanic isolator package.

The drawings are not necessarily to scale. Like numbers refer to like parts or steps throughout the drawings, unless otherwise noted.

DETAILED DESCRIPTION

Figure 3:
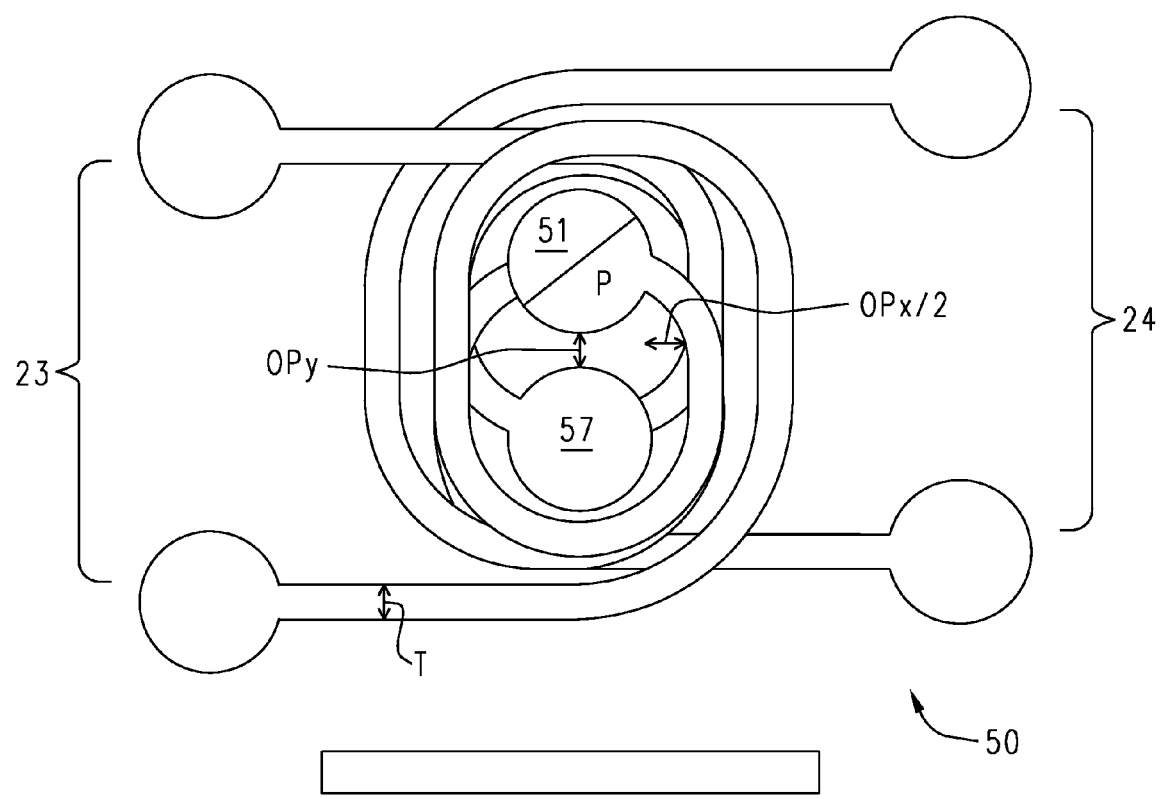
FIG. 3 is a top plan view of an embodiment of a coil configuration of the isolator of FIG. 1.

In the following description, specific details are provided to impart a thorough understanding of the various embodiments of the galvanic isolators and the circuits used to transmit and receive signals using galvanic isolators. Upon having read and understood the specification, claims and drawings hereof, however, those skilled in the art will understand that some embodiments of the invention may be practiced without hewing to some of the specific details set forth herein. Moreover, to avoid obscuring the invention, some well known circuits, materials and methods finding application in the invention are not disclosed in detail herein.

In the drawings, some, but not all, possible embodiments of the invention are illustrated, and further may not be shown to scale.

The term "horizontal" as used herein is defined as a plane substantially parallel to the conventional plane or surface of the substrate of the invention, regardless of its actual orientation in space. The term "vertical refers to a direction substantially perpendicular to the horizontal as defined above. Terms such as "on,", "above," "below," "bottom," "top," "side," "sidewall," "higher," "lower," "upper," "over" and "under" are defined in respect of the horizontal plane discussed above.

Referring to FIGS. 1 and 2, substrate 33 and coil transducer 39, coils 23 and 24 form a high voltage isolation data signal transfer or power transformer device, which is referred to herein as a galvanic isolator 20. The coil 23 is sometimes referred to as a first coil or a transmitter coil and the coil 24 is sometimes referred to as a second coil or a receiver coil. As shown in FIG. 2, the transmitter coil 23 is separated from the receiver coil 24 by at least portions of substrate 33, and transmitter coil 23 and receiver coil 24 are spatially arranged and configured respecting one another such that at least one of power and data signals may be transmitted by transmitter coil 23 to receiver coil 24 across a gap or dielectric barrier comprising electrically insulating, non-metallic, non-semiconductor, low dielectric loss material disposed therebetween, and from which at least portions of substrate 33 are formed. In one embodiment, such a dielectric barrier comprises coil transducer 39, which includes substrate 33 and electrically insulating layers 34 and 37 disposed atop and below substrate 33. Input or transmitter circuit 21 is operably connected to first transmitting coil 23 and output or receiver circuit 22 is operably connected to second receiving coil 24.

Coil transducer 39 and substrate 33 disposed therewithin may comprise any of a number of different non-metallic, non-semiconductor, low dielectric loss materials, more about which is said below. In a preferred embodiment, coil transducer 39 and substrate 33 are capable of withstanding several kilovolts of potential difference between the input and output sides of isolator 20, and thus exhibit high voltage breakdown performance characteristics.

Transmitter circuit 21 changes an incoming signal waveform into a signal having a waveform suitable for driving primary transmitting coil 23. Receiver circuit 22 is configured to change the signal exiting secondary receiver coil 24 back into a waveform that looks like the incoming signal. Transmitter circuit 21, receiver circuit 22, and coil transducer 39 are preferably packaged in a format compatible with standard electronics assembly processes, such as printed circuit board assembly techniques. In some embodiments, packaging comprises mounting the various components of galvanic isolator 20 on a lead frame, wirebonding the components together, and surrounding them with a molding material to hold everything together after sacrificial metal leads have been separated from the lead frame and formed into standard integrated circuit leads. In magnetic transducers, design of the leadframe is important to avoid degrading the performance of galvanic isolator 20.

As shown in FIGS. 1 and 2, galvanic isolator 20 comprises transmitter circuit 21 and receiver circuit 22, which in one embodiment comprise coils 23 and 24 disposed on opposing top and bottom sides of substrate 33. In another embodiment, coils 23 and 24 are disposed on the same side of substrate 33.

In the embodiment illustrated in FIGS. 1 and 2, circuits 21 and 22 are connected to bond pads 37, 38 and 47 on the top surface of layer 34. Alternatively, transmitter circuit 21 and receiver circuit 22 may be attached to a lead frame and connected by wire bonds to bond pads attached to coils 23 and 24. Other packaging embodiments are also contemplated. In one embodiment, coils 23 and 24 are fabricated by lithographically patterning metal layers on the surface of substrate 33, although many other means of forming coils 23 and 24 are contemplated, such as placing such coils on different layers or substrates and then laminating the substrates or layers together. Alternatively, an electrically insulating, non-metallic, non-semiconductor, low dielectric loss layer or substrate may be disposed below coils 23 and 24. Note that in preferred embodiments transmitter circuit 21 and receiver circuit 22 are integrated circuits or chips.

Substrate 33 and/or coil transducer 39 are formed of an appropriate electrically insulating, non-metallic, non-semiconductor, low dielectric loss materials. In one embodiment, a suitable such material has a dielectric loss tangent at room temperature that is less than about 0.05, less than about 0.01, less than about 0.001 or less than about 0.0001. Even though the material employed to form substrate 33 of the invention is a non-semiconductor material, we define dielectric loss tangent values associated therewith herein to permit comparison of the novel substrate material of the invention to known semiconductor materials. Further information regarding dielectric loss tangents and the intrinsic and extrinsic losses associated therewith is set forth in "Loss Characteristics of Silicon Substrate with Different Resistivities" to Yang et al., pp. 1773-76, vol. 48, No. 9, September 2006, Microwave and Optical Technology Letters. Yang et al. discuss theoretically and experimentally dividing dielectric losses into an intrinsic loss tangent of silicon and an extrinsic loss associated with substrate leakage losses, and demonstrate that as doping levels in silicon increase, extrinsic losses also increase.

Some examples of suitable materials for forming substrate 33 and/or coil transducer 39 also include, but are not limited to, one or more of printed circuit board material, FR4 and other printed circuit board materials, fiberglass, glass, ceramic, polyimide, polyimide film, a polymer, an organic material, a combination of an organic filler such as epoxy and an inorganic solid such as glass, a flex circuit material, epoxy, epoxy resin, a printed circuit board material, plastic, DUPONT™ KAPTON™, DUPONT™ PYRALUX AB™ laminate, and a ROGERS™ material (e.g., PTFE—or polytetrafluoroethylene—and glass, PTFE and ceramic, PTFE, glass and ceramic, or thermoset plastic). The particular choice of the material from which substrate 33 is formed will, in general, depend on cost, the degree or amount of electrical isolation or voltage breakdown protection that is desired, the particular application at hand, and other factors or considerations. For example, glass and ceramic substrates are well suited for applications involving high voltages; to reduce manufacturing and processing costs, flex circuit substrates may be employed.

In some embodiments, substrate 33 has sufficient thickness between the upper and lower horizontal surfaces thereof, and electrical insulation characteristics appropriate, to withstand the relatively high breakdown voltages for which galvanic isolator 20 and coil transducer 39 may be designed. By way of example, in one embodiment a breakdown voltage between transmitter coil 23 and receiver coil 24 exceeds about 2,000 volts RMS when applied over a time period of about one minute. In other embodiments, the breakdown voltage between transmitter coil 23 and receiver coil 24 exceeds about 2,000 volts RMS when applied over six minutes or over 24 hours. In other embodiments, even higher breakdown voltages can be withstood by coil transducer 39, substrate 33 and galvanic isolator 20, such as about 2,500 volts RMS, about 3,000 volts RMS, about 4,000 volts RMS and about 5,000 volts RMS for periods of time of about 1 minute, 6 minutes and/or 24 hours.

In some embodiments, substrate 33 and/or coil transducer 39 has a thickness between the upper and lower horizontal surfaces thereof ranging between about 0.5 mils and about 10 mils, or between about 0.5 mils and about 25 mils. In one embodiment, the thickness of substrate 33 and/or coil transducer 39 exceeds about 1.5 mils. In another embodiment, substrate 33 and/or coil transducer 39 comprises a plurality of layers, where at least one of the layers comprises a low dielectric loss material. As will be seen by referring to the Figures hereof, coil transducer 39 is generally thicker than substrate 33. For example, in one embodiment, coil transducer 39 is 19 mils thick, while substrate 33 disposed therein is 10 mils thick.

Continuing to refer to FIGS. 1 and 2, each of coils 23 and 24 has an outer end and an inner end. Each of these ends is connected to an appropriate terminal on the transmitter or receiver circuit associated therewith. In one embodiment, and in respect of each coil, a first electrical connection is established using a first trace formed with a first coil when the metal layer from which the first coil is patterned is etched, and a second electrical connection is established with the first coil using a patterned metal layer on an outer surface of coil transducer 39. For example, an electrical connection to inner end 26 of transmitter coil 23 is established through trace 25 disposed on the top surface of electrically insulating layer 34 and through vertical via 35 to underlying conductor 26 (from which transmitter coil 23 is formed). Similarly, an electrical connection to an outer end of transmitter coil 23 is established through trace 27 disposed within electrically insulating layer 34 and through vertical via 36 to overlying bond pad 47. An electrical connection to an outer end of transmitter coil 23 is made through trace 27, which may be patterned from the same layer as transmitter coil 23. Trace 27 is connected electrically to circuit 22 by via 36 disposed through layer 34. Circuit 21 is electrically connected to the outer end of receiver coil 24 by trace 29 and via 30. Trace 29 may be patterned from the same metal layer as receiver coil 24. An inner end of receiver coil 24 is electrically connected to circuit 21 by trace 28 disposed on the bottom surface of electrically insulating layer 37 through via 31. Insulating layers may be added atop or below the layers of metal, and may encapsulate or have disposed therewithin traces 25 and 28 so as to prevent electrical contact from being established between traces 25 and 28 and any external electrical conductors or surfaces that might otherwise come into contact with traces 25 and 28.

To facilitate the use of wire bonding techniques in the manufacture of galvanic isolator 20 or coil transducer 39, the structures shown in FIGS. 1 and 2 may be simplified to form two different metal layers disposed on a single substrate 33. In such an embodiment, coil transducer 39 may be constructed from two metal layers that are deposited and patterned on opposing sides of substrate 33. For example, the top metal layer may be patterned to provide transmitter coil 23 and the various connection pads utilized by transmitter circuit 21 and receiver circuit 22 on a top surface of substrate 33. The bottom metal layer may be used to fabricate receiver coil 24, which underlies transmitter coil 23 and forms second coil of the transformer on a bottom surface of substrate 33. The bottom layer may also be patterned to provide traces that are used to connect receiver coil 24 to wire bond pads disposed on the top surface of substrate 33 through vertical vias. Transmitter coil 23 may then be connected to transmitter circuit 21 by wire bonds, and receiver coil 24 may be connected to receiver circuit 22 by a trace patterned from the top metal layer and by a wire bond. In preferred embodiment, wire bond pads are electroplated. The various connection pads for connecting coil transducer 39 to external circuits that are to be isolated by coil transducer 39 may also be patterned from the top metal layer.

In one embodiment, the structures illustrated in FIGS. 1 and 2 may be fabricated using a conventional printed circuit board fabrication line. As a result, the cost of manufacturing coil transducer 39 may be much less than that of a coil transducer constructed from silicon on a semiconductor fabrication line. In addition, silicon substrates are known electrical conductors or semi-conductors, and do not exhibit the low dielectric loss properties of the substrates and coil transducers of the invention. Embodiments of coil transducer 39 based on flexible organic/inorganic or organic substrates are particularly attractive. Printed circuit boards or circuit carriers are known in the art, and hence need not be discussed in detail here. It is worth noting, however, that substrates 33 and coil transducers 39 of the invention that are formed from printed circuit board materials do provide an excellent low-cost alternative to silicon-based materials. Printed circuit board materials are less expensive, easier to handle, and more amenable to quick design or manufacturing changes than silicon-based materials. For purposes of the present discussion it is sufficient to note that printed circuit boards may be fabricated by depositing a thin metal layer, or attaching a thin metal layer, on a somewhat flexible organic/inorganic substrate formed of fiberglass impregnated with epoxy resin and then converting the layer into a plurality of individual conductors using conventional photolithographic techniques. Additional metal layers may be added atop the thin metal layer after an intervening electrically insulating layer or coating has been laid down on the thin metal layer.

Flex circuit technology may also be employed to form substrate 33 and/or coil transducer 39 of galvanic isolator 20, where substrate 33 and/or coil transducer 39 are made of an organic material such as polyimide. Films and laminates of this type are available commercially from DUPONT™ and utilize substrate materials known as KAPTON™ made from polyimide. In some cases, a plurality of polyimide layers may be laminated with an adhesive to form substrate 33 and/or coil transducer 39. This type of circuit carrier or printed circuit board is significantly less expensive than conventional silicon semiconductor material based approaches and can be employed to provide substrate 33 and/or coil transducer 39 having a high breakdown voltage and other desirable high voltage isolation characteristics. Thinner substrates 33 and/or coil transducers 39 are preferred in applications where signal losses between primary and secondary coils 23 and 24 must be minimized. For example, in one embodiment of substrate 33 and/or coil transducer 39, a PYRALUX AP™ laminate manufactured by DUPONT™ is employed to form a 2 mil thick KAPTON™ substrate 33, and electrically conductive copper layers and traces are added to the top and bottom surfaces thereof.

Note that coils 23 and 24 may assume any of a number of different structural configurations and nevertheless fall within the scope of the invention. For example, coils 23 and 24 may assume the circular or oval spirally-wound shapes illustrated in FIGS. 1 and 2, or may assume myriad other shapes such as rectangularly, squarely, triangularly, pentagonally, hexagonally, heptagonally or octagonally-wound shapes arranged in a horizontal plane, conductors arranged to interleave with one another within a horizontal plane, one or more serpentine conductors arranged in a horizontal plane, and so on. Any suitable structural configuration of coils 23 and 24 is permitted so long as the magnetic fields projected by one coil may be received and sufficiently well detected by the other opposing coil.

Two different coil configurations having different bandwidths are described below. A first coil configuration 50 is shown in FIG. 3. The coil configuration 50 includes both the transmitter coil 23 and the receiver coil 24. The coil configuration 50 is representative of the transmitter coil 23 being on two layers and the receiver coil 24 being on another two layers.

The coil configuration 50 is referred to as an oval configuration and may occupy several different layers in a substrate. In the embodiment of FIG. 3, a first layer or first metal has 1⅜ turns. A second layer has ⅞ of a turn. The traces in the first metal and the second metal are connected by a first via wherein a first via pad 51 associated with the first via is shown in FIG. 3. A second via pad associated with the first via may be located opposite the first via pad 51. A second via may connect metal three and metal four. A third via pad 57 is associated with the second via. Per FIG. 3, the transmitter coil 23 may occupy two layers or metals. The receiver coil 24 may have the same configuration as the transmitter coil 23 and may occupy metal 3 and metal 4. The separation between the coils 23, 24 described above would then occur between metal 2 and metal 3.

In the embodiment of FIG. 3, the via pad diameter, P, is approximately 150 um and the width, T, of the traces is approximately 35 um. The coil configuration has an opening in the center wherein the horizontal direction (as viewed from FIG. 3) has a length, OPX of approximately 70 um and the orthogonal direction has a length, OPY, of approximately 35 um. The length OPY as shown in FIG. 3 is the length when viewed substantially perpendicular to the galvanic isolator 20. However, the length OPY may extend between different layers, so the actual length may be longer than 35 um. The length OPX/2 is the distance between two segments. The first segment is a mutual tangent segment extending between the circumference of via pad 51 and the circumference of via pad 57, chosen so that both via pad 51 and via pad 57 lie on the same side of the segment. The second segment is the inner edge of the nearest trace as shown. The length OPX is twice this distance. The bandwidth characteristics of this coil configuration 50 are described in greater detail below. In one embodiment, the distance OPX/2 is the shortest distance between the segments. In another embodiment the second of the segments extends along at least a portion of a substantially straight trace, wherein the substantially straight trace is located most proximate the first segment relative to other traces.

Figure 4:
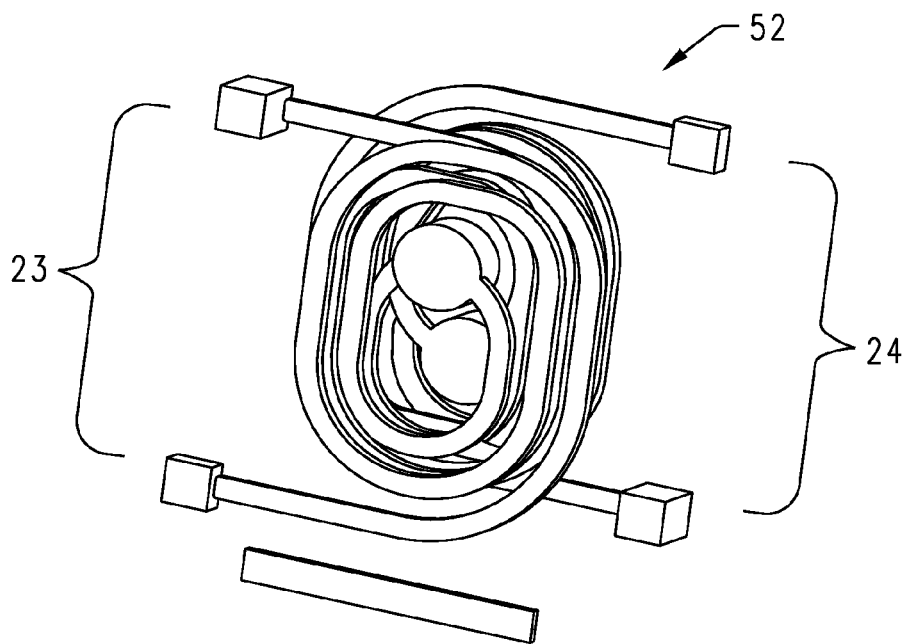
FIG. 4 is a perspective view of another embodiment of a coil configuration of the isolator of FIG. 1.
Figure 5:
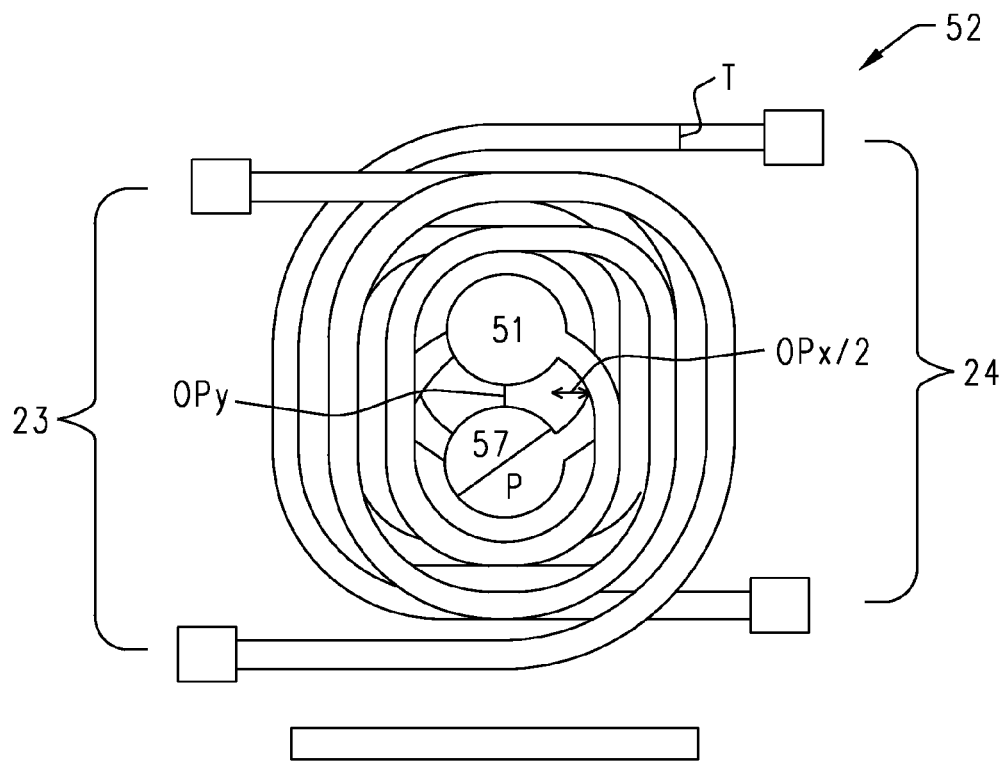
FIG. 5 is a plan view of the coil configuration of FIG. 4.

The second coil configuration 52 is shown in FIG. 4 and FIG. 5, wherein FIG. 4 is a perspective view and FIG. 5 is a plan view. The coil configuration 52 has the same dimensions as the coil configuration 50, except the coil configuration 52 has 2⅜ turns on the top layer. The numbers of turns in the other metal layers have increased as well. As shown below, the number of coils offers different bandwidth characteristics for the isolator 20, FIG. 2.

Figure 6:
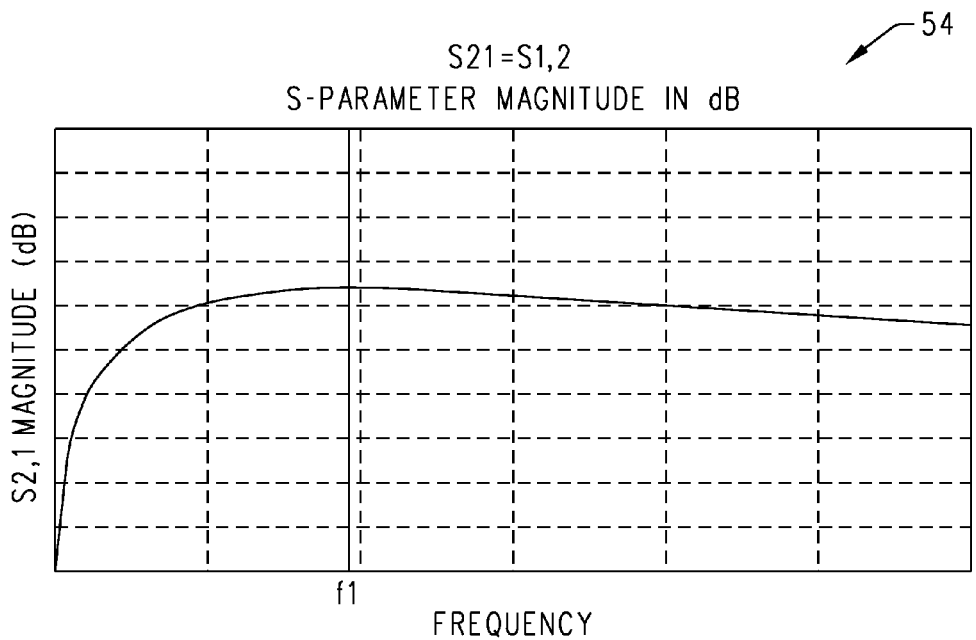
FIG. 6 is a plot of the $S_{21}$ characteristics of the coil configuration of FIG. 4.
Figure 7:
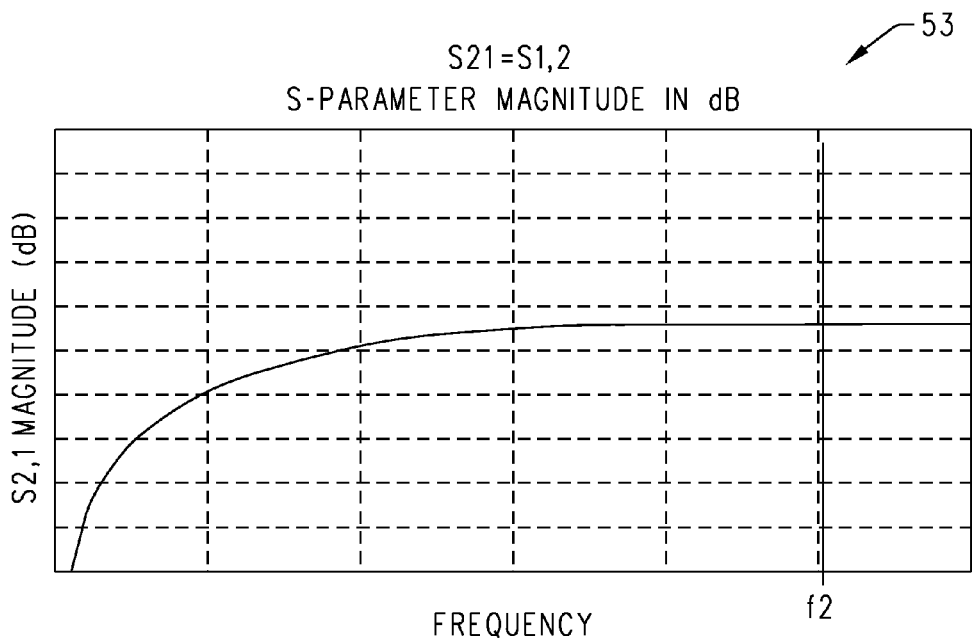
FIG. 7 is a plot of the $S_{21}$ characteristics of the coil configuration of FIG. 3.

The S-parameters of the coil configurations 50 and 52 are shown in the graphs of FIG. 6 and FIG. 7. A first plot 53, FIG. 7, shows the $S_{21}$ characteristics of the first coil configuration 50. As shown by the plot 53, the peak transmission occurs at a frequency f2. This peak is quite broad so the coil transmission has a wide bandwidth. A second plot 54, FIG. 6, shows the $S_{21}$ characteristics of the coil configuration 52. As shown, the peak frequency is lower at f1, and the peak has a higher magnitude. The peak is still broad, but the bandwidth is narrower than the plot 53. Thus, the addition of turns in the coil increases the magnitude of the transmission throughput while reducing the peak frequency and bandwidth. Adding more turns may be disadvantageous to coil design. In some embodiments, the coil configuration 52 is used in the galvanic isolator 20.

Figure 8:
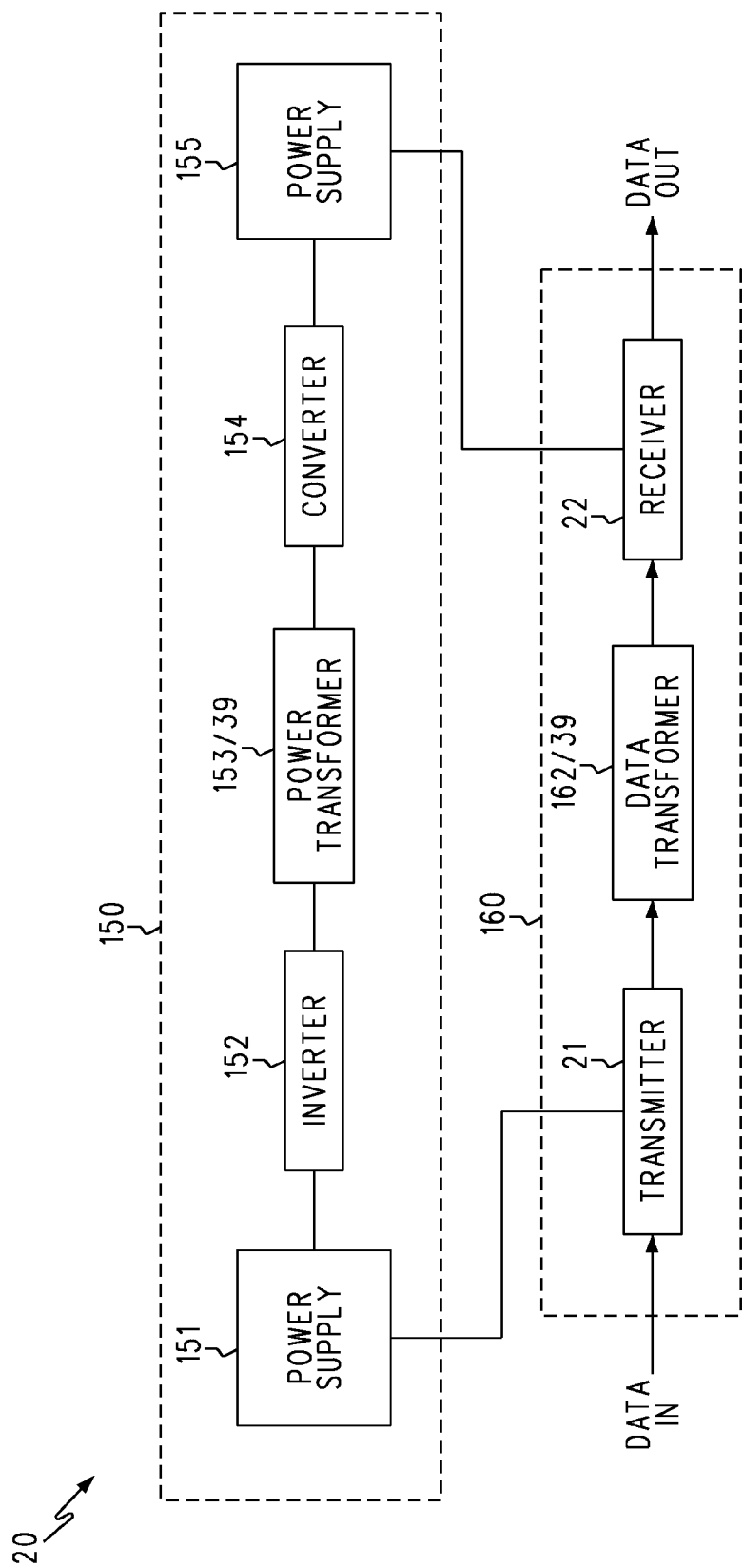
FIG. 8 illustrates a block diagram of an embodiment of a galvanic isolator comprising power and data transformers.

In some embodiments, galvanic isolator 20 may comprise transformers in which the electronic and electrical components on one side of substrate or isolation barrier 33 are powered by a power source disposed on the opposing side of substrate 33. Referring now to FIG. 8, there is shown galvanic isolator 20 comprising power section 150 and data transfer section 160. Data transfer section 160 includes an isolation gap that blocks transients and/or performs voltage shifts between the circuitry disposed on the transmitter side of the isolation gap and the circuitry disposed on the receiver side of the isolation gap.

Galvanic isolator 20 utilizes two transformers. Transformer 162 provides an isolation barrier for the transfer of data between transmitter 21 and receiver 22. Transformer 153 is used to transfer power from power supply 151 disposed on the transmitter side of the isolation gap to power supply 155 disposed on the receiver side of the isolation gap.

Power section 150 includes optional power supply 151 configured to power circuitry on both sides of the isolation gap. Inverter 152 generates an AC or oscillatory power signal from the DC power provided by power supply 151. The AC or oscillatory power signal is transferred to the receiver side of the isolation gap by a power transformer 153. The output of the secondary winding of power transformer 153 is rectified by converter 154 to provide isolated power supply 155 that is used to power receiver 22. The DC potentials provided by power supplies 151 and 155 may be the same or different, depending on the particular galvanic isolator design and application at hand. One advantage of various embodiments of the invention is that power may be safely and conveniently provided across substrate 33 and/or coil transducer 39, and thus is well adapted for medical applications and other applications where electrically isolated power may be difficult or costly to provide. Power transformer 153 can provide a voltage step up or step down to facilitate the generation of the different output voltages. Alternatively, power may also be derived from a train of pulses applied to power transformer 153 from a source external to galvanic isolator 20.

It will now become apparent that various embodiments of galvanic isolator 20, coil transducer 39, and substrate 33 may be configured as high voltage isolation data transfer devices, power transformers, or both. Note further that the term "transformer" or "transducer" as employed herein means a device capable of transmitting and receiving power or data signals, or power and data signals, across a gap or dielectric barrier formed of an electrically insulating material.

Referring now to FIGS. 9 and 10, there are shown top and side views of one embodiment of galvanic isolator 20, respectively, where input lead frame 71 and output lead frame 73 underlie and extend beneath portions of substrate 33 and coil transducer 39. Input lead frame 71 and output lead frame 73 are preferably connected to coil transducer 39 such that electrically conductive portions of input lead frame 71 and output lead frame 73 do not extend beneath substrate 33 and coil transducer 39 to locations disposed vertically directly beneath transmitter coil 23 or receiver coil 24.

Figure 11:
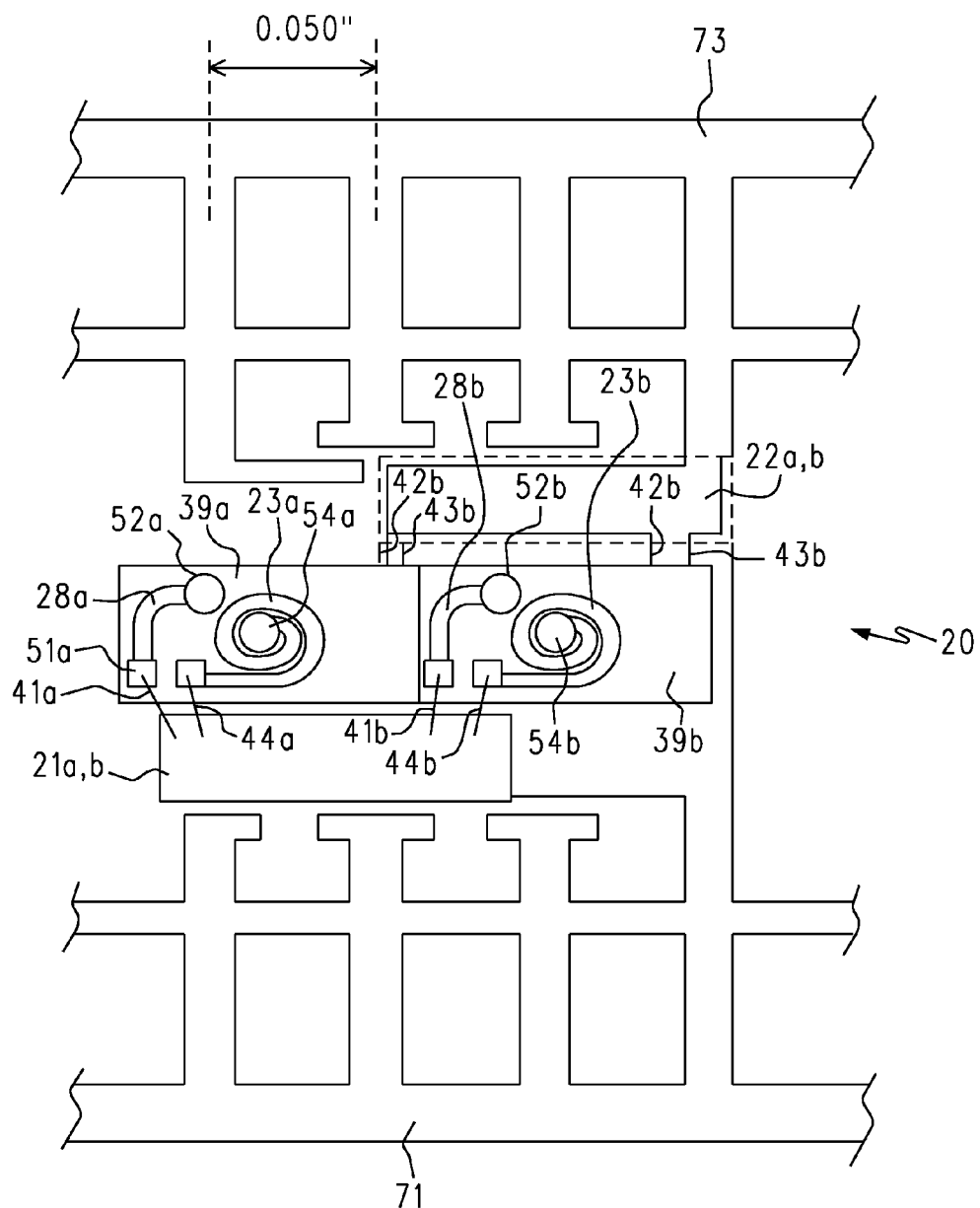
FIG. 11 illustrates another embodiment of a galvanic isolator package.

In the embodiment illustrated in FIGS. 9 and 10, input lead frame 71 and output lead frame 73 are connected to coil transducer 39 such that input lead frame 71 and output lead frame 73 are mechanically connected to a lower side of coil transducer 39. In another embodiment, however, input lead frame 71 and output lead frame 73 are mechanically connected to opposing top and bottom sides, respectively, of coil transducer 39, such as is shown in FIG. 11.

If a metal layer is placed too close to the respective horizontal planes of coils 23 and 24, the magnetic field lines transmitted or sensed thereby will be disturbed and the efficiency (throughput $S_{21}$) will be decreased. Furthermore, input and output lead frames 71 and 73 must be adequately separated to prevent arcing from inadvertently electrically connecting transmitter circuit 21 to receiver circuit 22. Consequently, it is desirable to design lead frames 71 and 73 so that the input side of the lead frame extends just far enough underneath coil transducer 39 that the bondpads lie above the lead frame for easy wirebonding, but not so far beneath coil transducer 39 as to extend directly beneath portions of coils 23 and 24. Transmitter circuit or integrated circuit 21, or inverter 152, may then be mounted on the input side of leadframe 71 next to the input side of coil transducer 39, and receiver circuit or integrated circuit 22, or converter 154, may be mounted on the output side of leadframe 73 next to the output side of coil transducer 39.

Continuing to refer to FIGS. 9 and 10, it should be noted that the electrical potential difference between lead frames 71 and 73 and coil transducer 39 may be several kV; in some embodiments lead frames 71 and 73 may be held at or near electrical ground. Mounting of integrated circuits 21 and 22 on lead frames 71 and 73 can be accomplished with epoxy 68 and 69. Epoxy 68 and 69 are preferably electrically non-conductive to reduce the possibility of unwanted short circuits being created through the epoxy. Transmitter circuit 21 is preferably wirebonded to the input side of coil transducer 39 though wirebonds 41 and 48. Receiver circuit 22 is preferably wirebonded to the output side of coil transducer 39 through wirebonds 42 and 43.

As described above, substrate 33 and/or coil transducer 39 are preferably fabricated to have a thickness between their respective upper and lower surfaces sufficient to prevent high voltage arcing. One advantage of the materials employed to form substrate 33 and/or coil transducer 39 of the invention is that substrate 33 and/or coil transducer 39 may be substantially thicker than is generally possible or financially feasible in commercial applications which employ conventional semiconductor materials and manufacturing processes. For example, substrate 33 and/or coil transducer 39 may have thicknesses ranging between about 1 mil and about 25 mils, between about 1.5 mils and about 25 mils, or between about 2 mils and about 25 mils. Polyimide processes compatible with silicon IC processes are typically much thinner and cannot withstand voltages nearly as high as those capable of being withstood by some embodiments of substrate 33 and/or coil transducer 39. The high distance-through-insulation (DTI) values characteristic of some embodiments of substrate 33 and coil transducer 39 provide a desirable performance metric in many electrical isolator applications and easily meet most certification requirements issued by relevant standards organizations. Conversely, substrate 33 and/or coil transducer 39 may also be made quite thin, e.g., 0.5 mils or less, and yet still provide relatively high voltage breakdown performance characteristics.

Note further that substrate 33 and/or coil transducer 39 of the invention may be formed using any of a number of different manufacturing processes and electrically insulating, non-metallic, non-semiconductor, low dielectric loss materials described above. These processes and materials are amenable to processing electrically insulating materials in bulk and do not require the expensive and elaborate procedures required to handle semiconductor materials such as silicon. Moreover, substrate 33 and coil transducer 39 of the invention provide superior high voltage breakdown performance characteristics respecting silicon-based devices owing to their increased distances-through-insulation (more about which is said above). Because substrate 33 and coil transducer 39 of the invention exhibit substantially increased distances-though-insulation and thicknesses respecting prior art galvanic isolators having silicon substrates (which were generally limited to thicknesses of less than 1 mil), substrate 33 may be configured to impart substantial mechanical rigidity and strength to coil transducer 39 and galvanic isolator 20. Unlike the relatively fragile and thin silicon substrates of the prior art, substrate 33 and coil transducer 39 of the invention are mechanically robust and strong, may be mounted directly on lead frames, and may be handled without special care.

In addition, although in theory it might be possible to manufacture a substrate or coil transducer from semiconductor material upon opposing surfaces upon which conductors could be formed using metalized layers, such constructions are rarely (if at all) seen in practice owing to the general delicacy of the substrates formed using semiconductor materials. As a result, substrates or coil transducers formed from semiconductor materials are typically handled in a manner that requires metalized or other layers be formed on one side only of such substrates. Contrariwise, in substrate 33 and/or coil transducer 39 of the invention, both sides of substrate 33 and/or coil transducer 39 may easily have coils or other components formed or mounted thereon owing to the radically different nature of the manufacturing processes used, and the materials employed, to form substrate 33 and/or coil transducer 39.

Continuing to refer to FIGS. 9 and 10, note that several channels may be accommodated in a single package by stacking channels side by side along the long dimension of a package such as an SO-16 widebody so that all channels share the same input lead frame and ground, and so that all channels share the same output lead frame and ground.

Referring now to FIG. 11, there is shown a flip lead frame arrangement for dual galvanic isolator 20. Each of integrated circuits 21 and 22 contains two channels. This design provides two channels rather than the single channel configuration illustrated in FIGS. 4 and 5. Lead frames 71 and 73 are designed to permit a flip, as is the case in many opto-isolator lead frames finding common use today. First, integrated circuit 22a,b and the nearby ends of coil transducers 39a and 39b are attached to corresponding respective portions of lead frame 73 and wirebonded thereto. Integrated circuit 21a,b is attached to lead frame 71. Then lead frame 73 is flipped over into the position shown in FIG. 11, the other ends of coil transducer 39a and 39b are attached to corresponding sides of lead frame 71, and finally wirebonded together. Those skilled in the art will understand that many other configurations are possible. For example, dual-channel devices may be configured to have separate transmitter circuit chips 21 and receiver circuit chips 22 for each channel.

Figure 12:
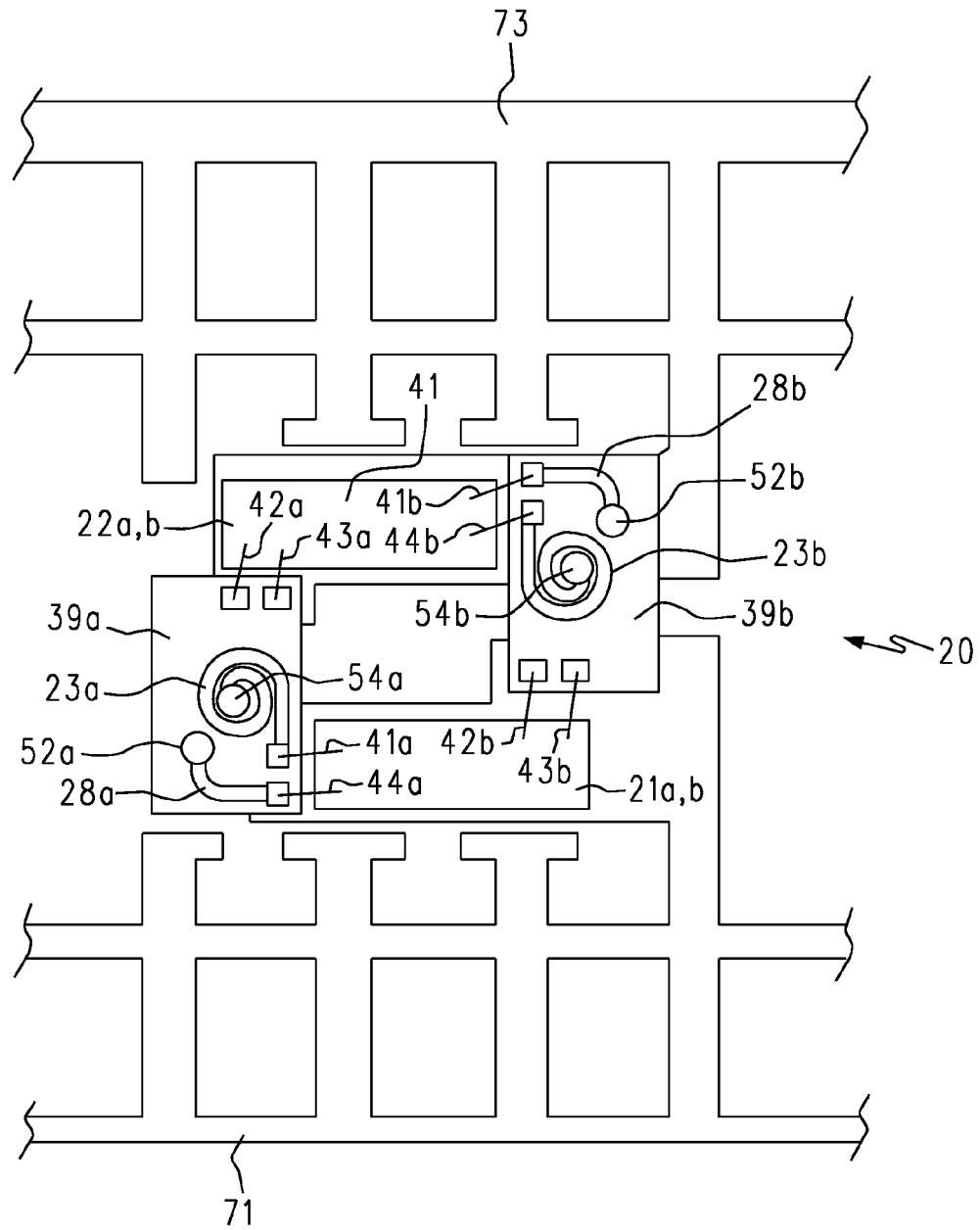
FIG. 12 illustrates still another embodiment of a galvanic isolator package.

FIG. 12 shows another embodiment of a package of the invention, also configured for two channels. The embodiment illustrated in FIG. 12 is a small format package design that includes two coil transducers 39a and 39b, a dual-channel transmitter IC 21 a,b, and a dual-channel receiver IC 22 a,b.

Even if substrate 33 and/or coil transducer 39 have good internal high voltage breakdown performance characteristics, isolator 20 based on such substrate 33 and/or coil transducer 39 may not exhibit good high voltage breakdown performance characteristics unless all potential arcing paths within isolator 20 have been eliminated or blocked. To reduce the chances of arcing, a thick coverlay is preferably employed in a package. No voids should be present between the layers of galvanic isolator 20 and/or coil transducer 39, or between the various components of isolator 20 and the coverlay. The adhesion between the different layers of coil transducer 39 should remain strong during die separation, so that no delamination results. It is good practice to locate the bus bars for electroplating together near the appropriate wirebond pads in order to avoid busbar-to-busbar conduction along the sides of coil transducer 39.

In opto-isolators, the space between the LED and the receiver containing a photodetector is typically filled with an optically transparent insulating material such as silicone. In magnetic induction galvanic isolators, while optical transparency is not required, silicone may still be employed advantageously. Silicone is a considerably better electrical insulator than air and also adheres well to many other materials, and therefore may be used advantageously to inhibit the formation of air gaps between different parts of galvanic isolator 20 and/or coil transducer 39 during thermal cycling. Furthermore, silicone has low dielectric loss characteristics and thus does not disturb the operation of coils 23 and 24. In a preferred embodiment, silicone is therefore emplaced around at least portions of coil transducer 39 and/or galvanic isolator 20 to enhance the electrical isolation characteristics of isolator 20. While this step may be omitted to reduce costs, performance may also be compromised if silicone is not used.

Galvanic isolator 20 and/or coil transducer 39 are preferably overmolded. In one embodiment, lead frame 71, coil transducer 39, and lead frame 73 are attached to one another, wirebonded, and placed in a mold. A melted appropriate electrically insulating molding material such as epoxy is forced into the mold to encapsulate at least portions of the package. The molding material is then allowed to cool and harden, thereby imparting substantial additional structural rigidity to the resulting package. The molding material preferably has an appropriate dielectric constant and low dielectric loss such that the electrical performance of galvanic isolator 20 is not degraded. The leads are then trimmed and bent.

The packaging examples described and shown herein are not meant to cover all possibilities for packaging galvanic isolator 20 of the invention, and many different variations and permutations are contemplated.

The various embodiments of galvanic isolators 20 configured for isolated signal transfer disclosed herein are AC or oscillatory signal devices, which generally behave like differentiators in the manner in which they respond to transitions in incoming signals. In order to achieve higher efficiency in the transfer of data via the galvanic isolator 20, the data is in the form of signals that are transformed as summarily described in the block diagram of FIG. 13. In summary, a series of pulses is transmitted via the galvanic isolator 20 rather than impulse-type signals. The pulses have a lower frequency spectrum than impulse-type signals, which enables better transmission via the galvanic isolator 20.

The signals or data are input to an edge detector 200 via an input 202. It is noted that the data is binary data having a logic one or a logic zero state as commonly used in data transfer techniques. The edge detector 200 has a positive output 204 and a negative output 206. The positive output 204 is activated when the input signal transitions from a logic zero to a logic one. This transition is also referred to as a leading edge. The negative output 206 is activated when the input signal transitions from a logic one to a logic zero. This transition is also referred to a trailing edge. In some embodiments, the edge detector 200 is described as having two components, a positive edge detector and a negative edge detector. It is noted that the leading edge and trailing edge described herein are for exemplary purposes. In some embodiments, a leading edge may be transition from a logic one to a logic zero and a trailing edge may be a transition from a logic zero to a logic one.

The positive output 204 is connected to a positive pulse generator 210. Likewise, the negative output 206 is connected to a negative pulse generator 212. In one embodiment, the activation of the positive output 204 activates the positive pulse generator 210. In a similar manner, activation of the negative output 206 activates the negative pulse generator 212. The positive pulse generator 210 generates a plurality of positive pulses when activated. More specifically, the positive pulse generator 210 generates a plurality of positive pulses when the leading edge of the data signal at the input 202 is detected. The negative pulse generator 212 generates a plurality of negative pulses when activated. As with the positive pulse generator 210, the negative pulse generator 212 generates a plurality of negative pulses when a trailing edge of the data signal at the input 202 is detected. The pulse generators 210, 212 may be active for a time corresponding to less than half the width of the pulse.

The pulses generated by the positive pulse generator 210 and the negative pulse generator 212 are used to drive the transmitter coil 23. A driver may be located between the pulse generators 210, 212 and the transmitter coil 23. The pulses consist of spectral frequencies that match the coils 23, 24, which provides for greater energy transfer to the coils 23, 24. For example, less energy is reflected from the transmitter coil 23 because of the match. In conventional galvanic isolators, the coils are driven with signals, such as impulse or step functions that have high frequency components. These high frequency components do not transfer well into coils used in galvanic isolators. The pulses generated by the positive pulse generator 210 and the negative pulse generator 212 have lower frequency components that match the transmitter coil 23. Therefore, more energy is able to be transferred to the transmitter coil 23 and ultimately to the receiver coil 24.

The receiver 22 receives data from the receiver coil 24, which is the inverted signal of the signal driving the receiver coil 24. Therefore, the receiver 22 receives a plurality of negative pulses indicating the detection of a leading edge by the edge detector 200. The receiver receives a plurality of positive pulses indicating the detection of a trailing edge by the edge detector 200. The receiver 22 reconstructs the original data signal received at the input 202 based on the signals received from the receiver coil 24.

Figure 13:
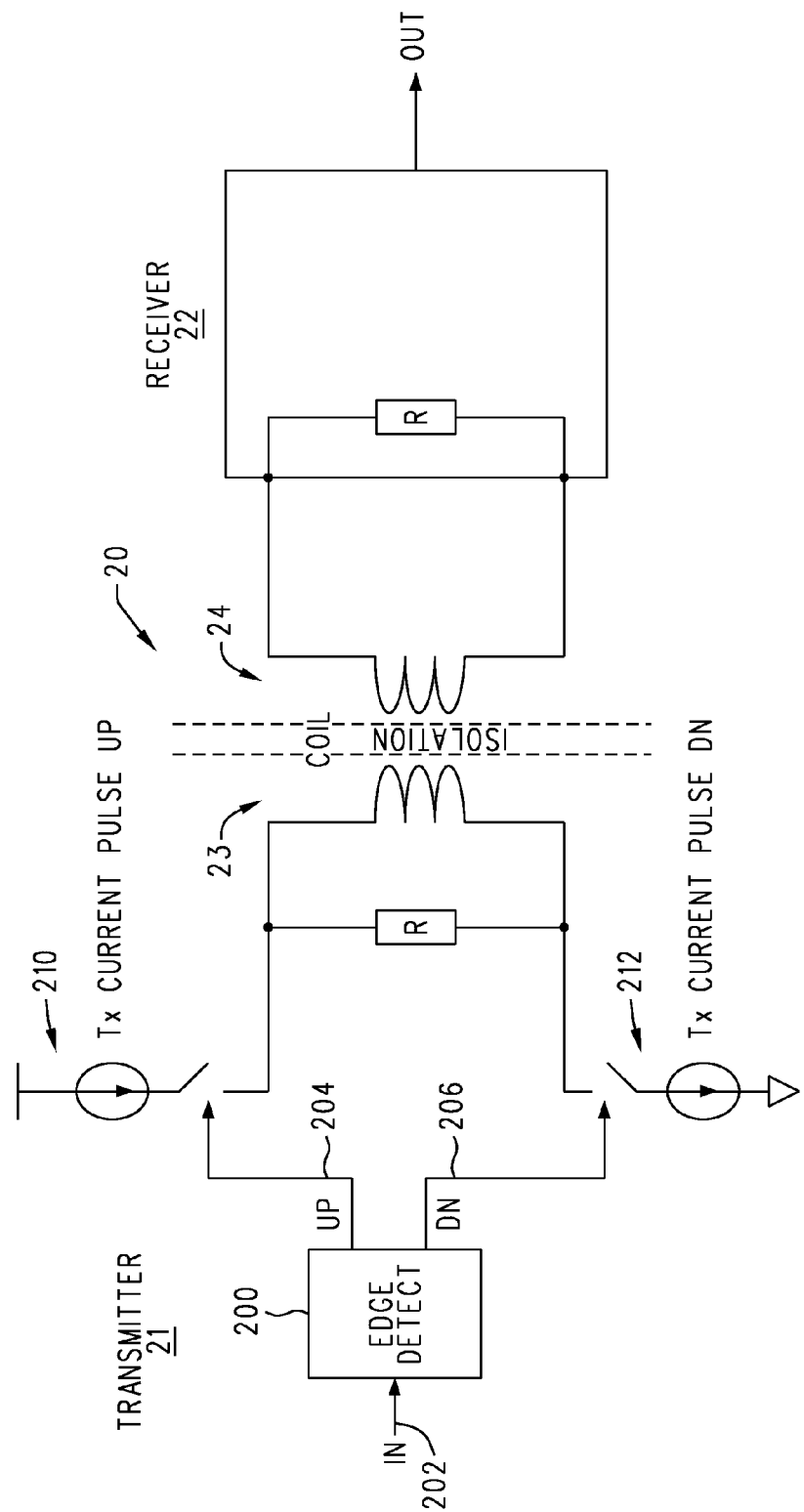
FIG. 13 is schematic illustration describing an embodiment of the transfer of data via a galvanic isolator.
Figure 14:
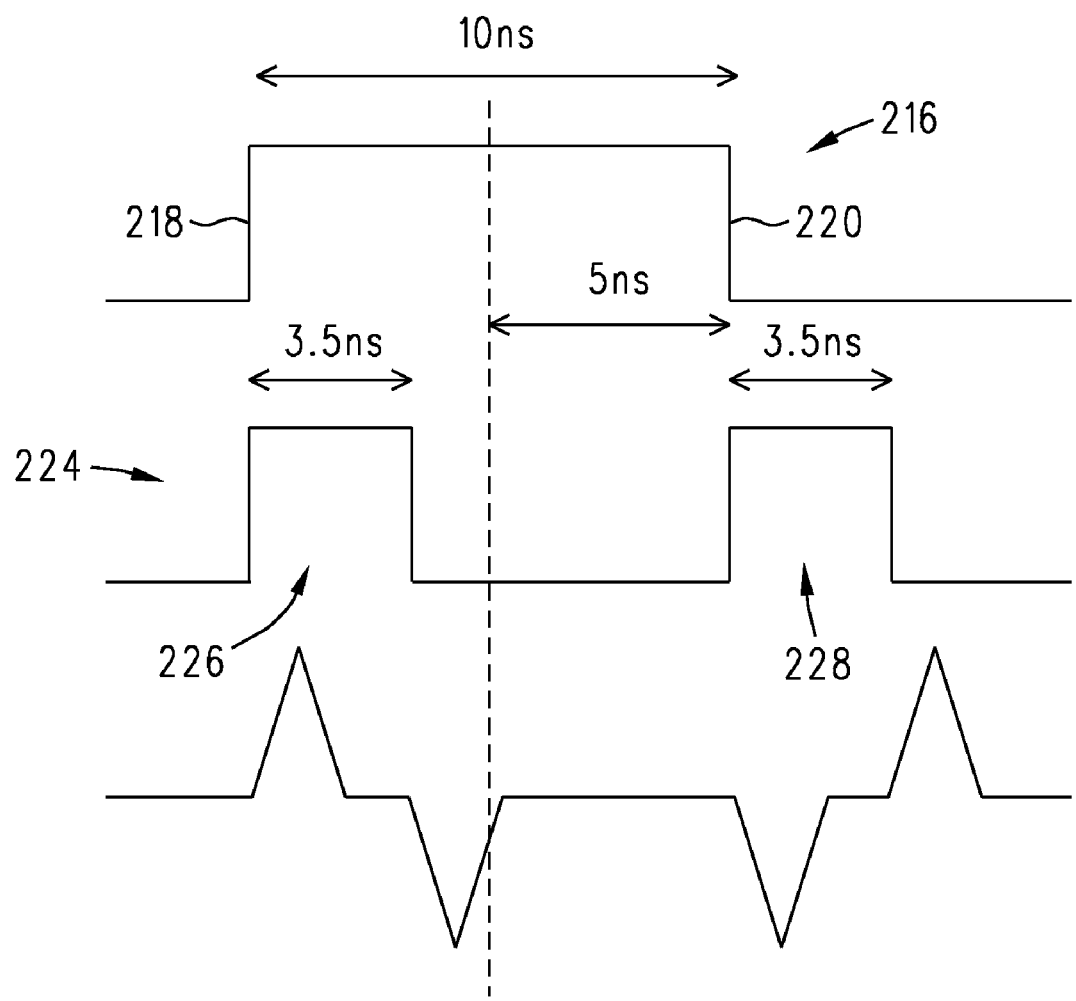
FIG. 14 is a diagram illustrating an embodiment of the data signals that are input to the galvanic isolator of FIG. 1.

Examples of the data signals that may be input to the input 202 of the edge detector 200 are shown in FIG. 14. With additional reference to FIG. 13, a data signal 216 is received at the input 202. The data signal 216 of FIG. 14 is a single binary pulse and is used for exemplary purposes. It is understood that the signal received at the input 202 may be a stream of data. The data signal 216 has a leading edge 218 and a trailing edge 220. The width of the data signal is the time between the leading edge 218 and the trailing edge 220. In the embodiment described herein, the data signal 216 has a width of ten nanoseconds.

Illustration 224 shows pulses that are generated based on the detection of the data signal 216 by the edge detector 200. In this embodiment, the edge detector 200 detects the leading edge 218 and activates the positive output 204 for 3.5 nanoseconds. The activation is shown by the pulse 226. After 3.5 nanoseconds, the positive output 204 is deactivated. When the edge detector 200 detects the trailing edge 220, the negative output 206 generates a pulse 228. The pulse 228 shows the activation of the negative output 206 for a period of 3.5 nanoseconds.

Figure 15:
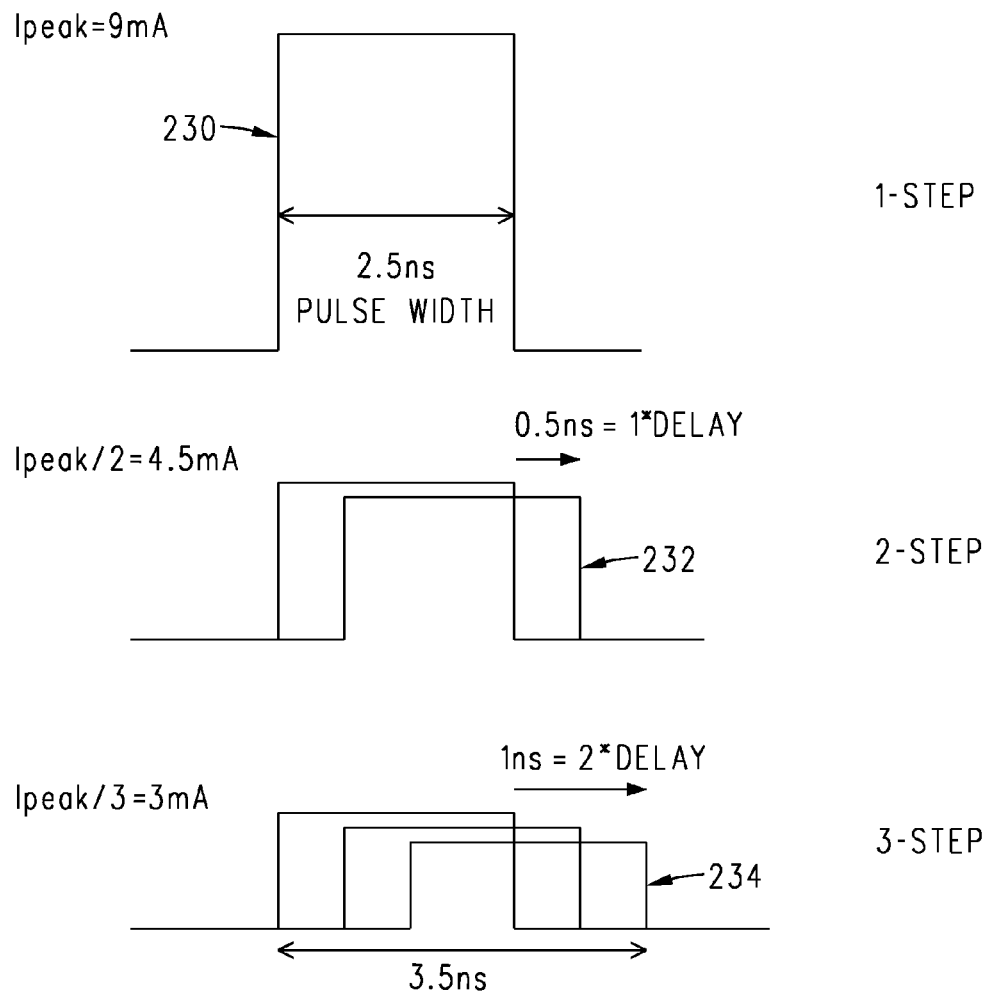
FIG. 15 is a timing diagram illustrating an embodiment of the signals output by the positive and negative pulse generators of FIG. 13.

An embodiment of the outputs of the positive pulse generator 210 and the negative pulse generator 212 are shown in FIG. 15. In the embodiments described herein, the positive pulse generator 210 and the negative pulse generator 212 each generate three pulses during the 3.5 nanosecond duration of the pulse described above. Reference is made to the positive pulse generator 210 which is substantially identical to the negative pulse generator 212. The positive pulse generator 210 generates three pulses that are each 2.5 nanoseconds long that overlap each other. A first pulse having a pulse width of 2.5 nanoseconds is generated, yielding the signal 230 in FIG. 15. After a period of 0.5 nanoseconds, a second pulse having a pulse width of 2.5 nanoseconds is generated yielding the signal 232. It is noted that the pulses having different amplitudes for illustration purposes. However, their amplitudes may be equal. After a last period of 0.5 nanoseconds, a third pulse having a pulse width of 2.5 nanoseconds is generated yielding the signal 234. As shown, the signal driving the coil 23 consists of three overlapping pulses. It is to be understood that the use of three overlapping pulses is for exemplary purposes only and that there may be more or less than three overlapping pulses.

As shown in FIG. 15, the current driving the transmitter coil 23 is consistent at 9 mA. It is noted that other values of the current may be used. The first pulse 230 has an amplitude of 9 mA. The two pulses of 232 have amplitudes of 4.5 ma each for a combined current of 9 mA. The three pulses of 234 have amplitudes of 3 ma each for a combined current of 9 mA.

Referring to FIG. 14 and FIG. 13, the transmitter coil 23 induces a current into the receiver coil 24, which is detected by the receiver 22 as described in greater detail below. The receiver 22 then recreates the data signal received at the input 202. For example, the receiver 22 may detect the three pulses indicative of the leading edge 218 of a data signal 216. The receiver 22 may then output a logic one. When the receiver 22 receives three pulses indicative of the trailing edge 220 of the data signal 216, the receiver may output a logic zero. Thus, the output of the receiver 22 is the same as the data signal at the input 202. It is noted that the current passing through the transmitter coil 23 may remain at 3 mA because the inductive properties of the coil will serve to maintain the current constant given the short pulses that are input to the transmitter coil 23.

Having described embodiments of the galvantic isolator 20, the individual components will now be described in greater detail.

Figure 16:
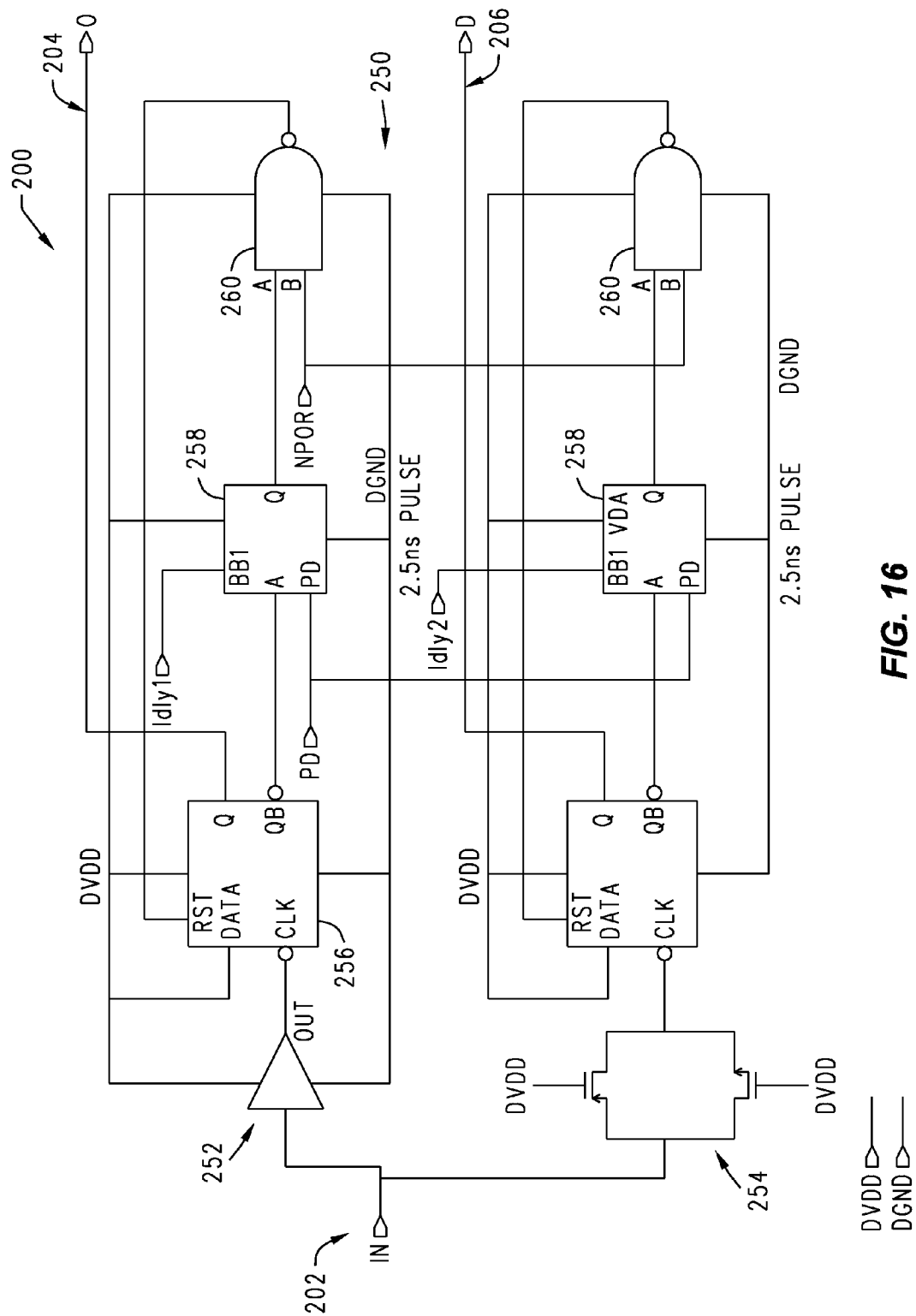
FIG. 16 is a schematic diagram of an embodiment of the edge detector of FIG. 13.

An embodiment of a circuit 250 constituting the components in the edge detector 200 is shown in FIG. 16. The input 202 branches to an inverter 252 and a delay circuit 254. The circuit connected to the output of the inverter 252 detects the leading edge 218 of the data signal 216 and generates the positive output 204. The circuit connected to the output of the delay circuit 254 detects the trailing edge 216 of the data signal 216 and outputs the negative output 206. The delay circuit 254 causes a signal delay equivalent to the inverter 252, which balances the timing between the upper and lower circuits. It is noted that the upper circuit and lower circuit may be referred to as individual edge detectors.

Referring to the upper circuit, a leading edge or positive transition received at the input 202 causes a negative transition to be output by the inverter 252. The output of the inverter 252 is connected to the clock input of a flip flop 256. The flip flop 256 may be an edge triggered D flip flop. When the flip flop 256 triggers, the output Q transitions to a high or logic one level until the flip flop 256 is reset. The inverted output QB of the flip flop 256 is connected to a delay element 258. The delay element 258 is triggered by the negative going transition of the inverted output QB. The output Q of the delay element 258 transitions in a time that is based on an input Idly. This delay may be 2.5 nanoseconds, which correspond to the duration of the pulses generated by the pulse generators. When the delay transitions its output Q, a reset is transmitted to the flip flop 256 via a NAND gate 260. An input of the NAND gate 260 is coupled to a master reset. When the flip flop 256 is reset, the positive output 204 returns to a logic zero state, which deactivates the positive pulse generator 210, FIG. 13. The lower circuit functions in the same manner as the upper circuit, but due to the lack of the inverter 252, the lower circuit triggers on a trailing edge being received at the input 202.

Figure 17:
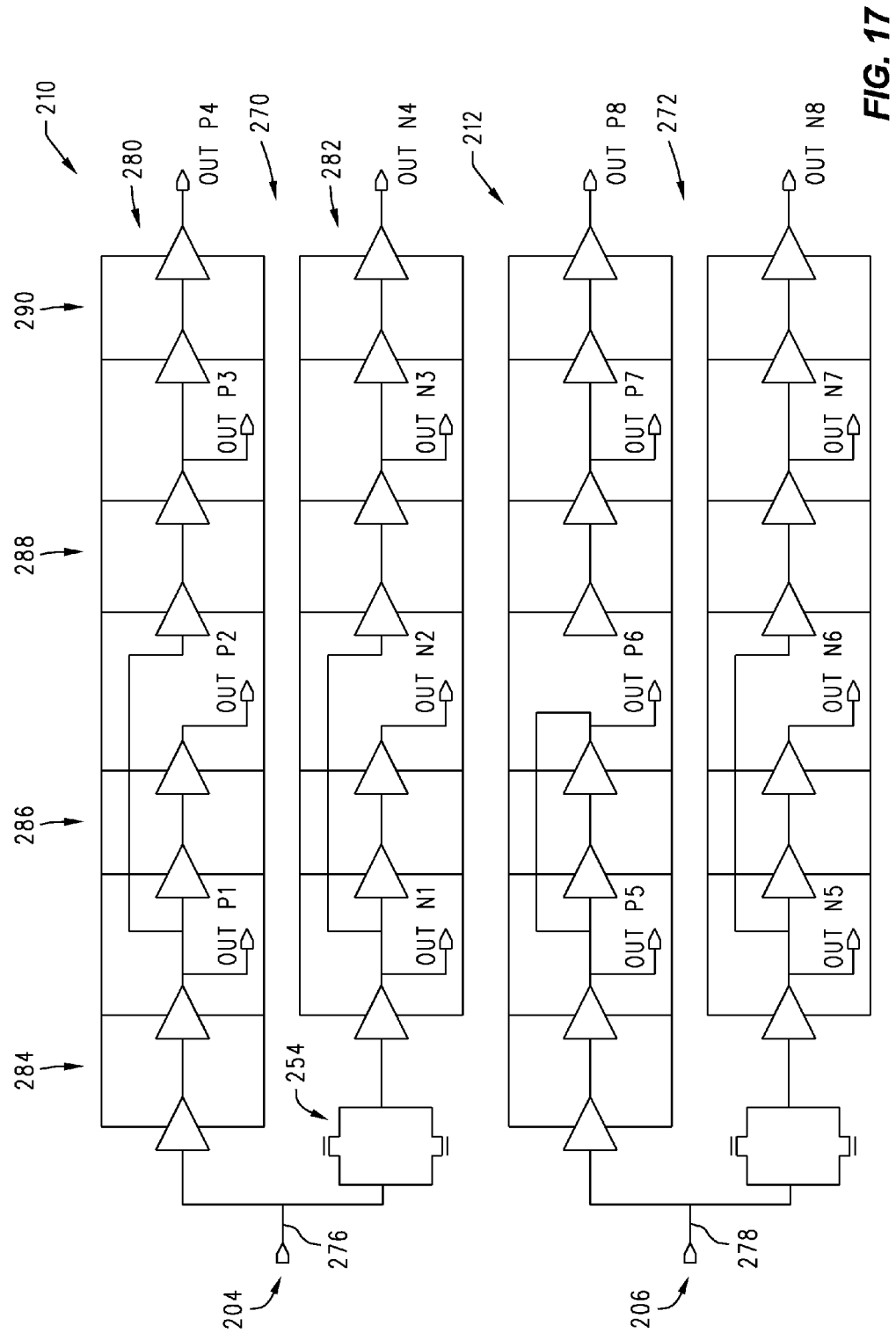
FIG. 17 shows schematic diagrams of circuits used for the pulse generators of FIG. 13.

Having described the edge detector 200, the pulse generators 210, 212 will now be described. An embodiment of circuits 270, 272 that may be used by the pulse generators 210, 212 is shown in FIG. 17. The circuit 270 generates the positive pulses and the circuit 272 generates the negative pulses. The circuit 270 will be described in detail. It is noted that the circuit 272 functions in a very similar manner as the circuit 270. In summary, the pulse generator circuit 270 consists of a plurality of delay elements, which in the embodiment of FIG. 17 are inverters connected in series.

The output 204 from the edge detector 200 is connected to an input 276 of the circuit 270. The output 206 from the edge detector 200 is connected to an input 278 on the circuit 272. The input 276 is split to two sections. The first section is referred to as the feed 280 and the second section is referred to as the return 282. The feed 280 drives the transmitter coil 23 and the return provides the return path.

The feed 280 and the return 282 each have four delay stages, which are referred to individually as the first delay 284, the second delay 286, the third delay 288, and the fourth delay 290. Each delay has a terminal or output that is connected to a driver that drives the transmitter coil 23. As described in greater detail below, each output pair is connected to a driver for the transmitter coil 23. For example, the output P1 and N1 serve to provide a current path to drive the transmitter coil 23 as described below. It is noted that three delays are created in the circuit 270 as the second and third delays occur simultaneously. In other embodiments, the circuit 270 may have three delays wherein none of the delays operate simultaneously. The use of three delays is for exemplary purpose. Other embodiments may have more or less than three delays.

The feed 280 is the same as the return 282 except for an additional inverter in the feed 280. In place of the extra inverter the return has a delay element 284 that has approximately the same delay as an inverter. The delay element 284 serves to make corresponding outputs trigger at the same time, but with opposite logic levels. For example, when the state of the input 276 changes, the state of out P1 and out N1 will change at the same time, however, they will have opposite logic levels. The same applies to all the outputs. Thus, an output out Px provides a drive and the output out Nx provides the return path.

Figure 18:
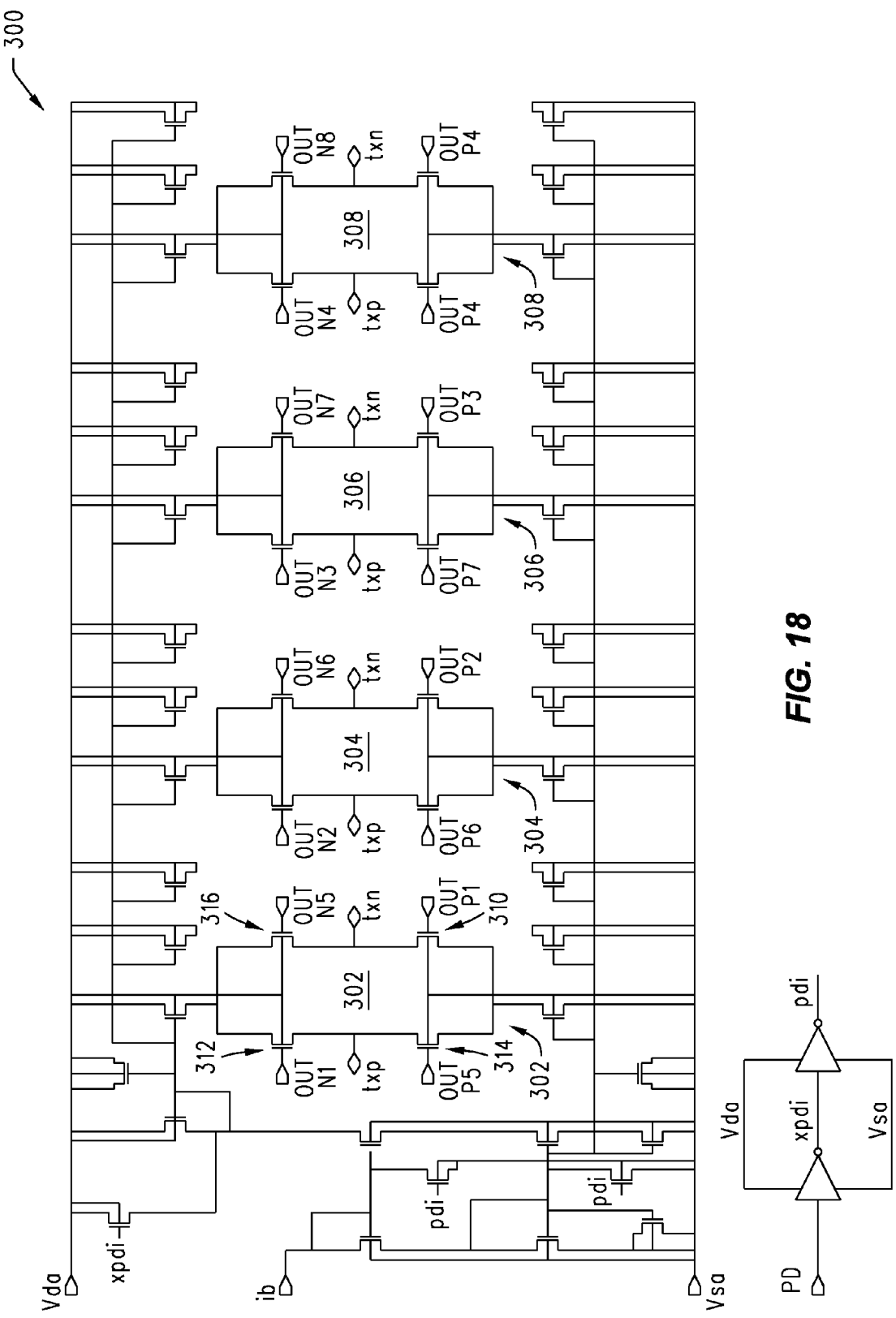
FIG. 18 is a schematic diagram of an embodiment of a driver located between the circuit of FIG. 17 and the transmitter coil.

The transmitter coil may have a significant current draw. Therefore, a driver may be located between the pulse generators 210, 212 and the transmitter coil 23. An embodiment of a driver 300 is shown by the schematic illustration of FIG. 18. The driver 300 uses current mirrors in a plurality of bridges as described below to drive the transmitter coil 23. The amount of current that is able to be drawn is set by the bias current Ib.

The transmitter coil 23 is connected to each of the outputs txp and txn. A first lead of the transmitter coil 23 is connected to each of the outputs txp and a second lead of the transmitter coil 23 is connected to each of the outputs txn. Accordingly, the outputs txp are connected together in parallel and the outputs txn are connected together in parallel. By controlling the direction of current through the transmitter coil 23, the bridges determine the polarity of the pulse generated by the transmitter coil 23.

The driver 300 has a plurality of bridges, which are referred to individually as the first bridge 302, the second bridge 304, the third bridge 306, and the fourth bridge 308. It is noted that the outputs of the circuits 270, 272, FIG. 17, are inputs to gates in the driver 300. Reference is made to the first bridge 302, which is similar to the remaining bridges. During detection of a leading edge by the edge detector 200, FIG. 13, the output P1 transitions to a logic 1 and the output N1 transitions to a logic zero. The outputs P1, N1 cause gate 310 and gate 312 to turn on, which enables them to conduct current. Gates 314 and 316 are off and do not conduct current. Based on the state of the gates in the first bridge 302, current passes from the txp lead on the transmitter coil 23 to the txn lead. The first bridge 302 supplies a predetermined current to the transmitter coil 23, which may be approximately 3 mA. As the remaining delays in the circuit 210 activate, the remaining bridges in the driver 300 turn on and supply current to the transmitter coil 23. Due to the configuration of the pulses driving the transmitter coil, the second bridge 304 and the third bridge 306 supply half the current of the first bridge 302 and the fourth bridge 308. Each activation of the circuit 210 causes current to pass from the output txp to the transmitter coil 23 and returns to the output txn. Thus, current flow remains in the same direction through the transmitter coil 23.

It is noted that the second bridge 304 and the third bridge 306 operate simultaneously for redundancy in the circuit 300. In some embodiments, three bridges may be provided wherein none of them operate simultaneously.

When the edge detector 200, FIG. 13, detects a trailing edge, the same processes described above apply, except current flows from the txn terminal, through the transmitter coil 23 and returns via the txp terminal. More specifically and referring to the first bridge, the gate 310 and the gate 312 will turn off so current cannot flow. The gate 314 and the gate 316 turn on allowing current to flow. The direction of current flow through the transmitter coil 23 is from the txn terminal and returns via the txp terminal, which is opposite the current flow described above. Accordingly, when the edge detector 200 detects a leading edge, current flows in a first direction through the transmitter coil 23. When the edge detector 200 detects a trailing edge, current flows in a second direction, opposite the first direction, through the transmitter coil 23. Based on the different current directions, the receiver 21 is able to determine whether a leading edge or a trailing edge has been transmitted via the isolator 20.

Isolation circuitry allows different portions of galvanic isolator 20 and/or coil transducer 39 to operate at significantly different potentials that may arise, for example, because of DC voltage differences, power line voltage differences, or ground potential differences. As described above, high voltage isolation is required between coils 23 and 24 of galvanic isolator 20 and coil transducer 39, which is achieved with the use of the materials described above to form substrate 33. One difficult aspect of common mode signals is the fast transients that arise between the grounds of transmitter circuit 21 and receiver circuit 22. An inherent capacitance exists between traces disposed on either side of substrate 33, and in particular between coils 23 and 24. This inherent capacitance includes capacitive coupling between the primary and secondary side of galvanic isolator/transformer 20.

Consider a capacitance between transmitter coil 23 and receiver coil 24 of about 1 pF. If a common mode transient between transmitter circuit 21 and receiver circuit 22 of 1 kV occurs with a slope of 50 kV/µsec, then the resulting current will be:

$$I = C \cdot dV/dt = 1 \text{ pF} \cdot 50 \text{ kV/µsec} = 50 \text{ mA eq.} \qquad (1)$$

This current will flow over a duration of:

$$t = V_{step}/(dV/dt) = 1 \text{ kV}/(50 \text{ kV/µsec}) = 20 \text{ ns} \qquad \text{eq. (2)}$$

The common mode design of galvanic isolator 20 is preferably configured to absorb a transient signal of such a magnitude over such a short period of time while maintaining proper signal transmission performance characteristics. Trade-offs must be made between magnetic coupling through coil transducer 39 and the spacing between transmitter coil 23 and receiver coil 24. As a result, the common mode rejection (CMR) design for galvanic isolator 20 becomes particularly challenging.

To maintain a common mode voltage of the transmitter outputs as well as the receiver inputs so they remain well within the operating supply rails of the system, common mode current must be absorbed or supplied, depending on the direction of the common mode current flow due to the changing ground potential difference between the transmitter and the receiver. Common mode current compensation may be achieved by a common mode amplifier whose output is capable of handling the large amounts of common mode current that are generated.

Figure 19:
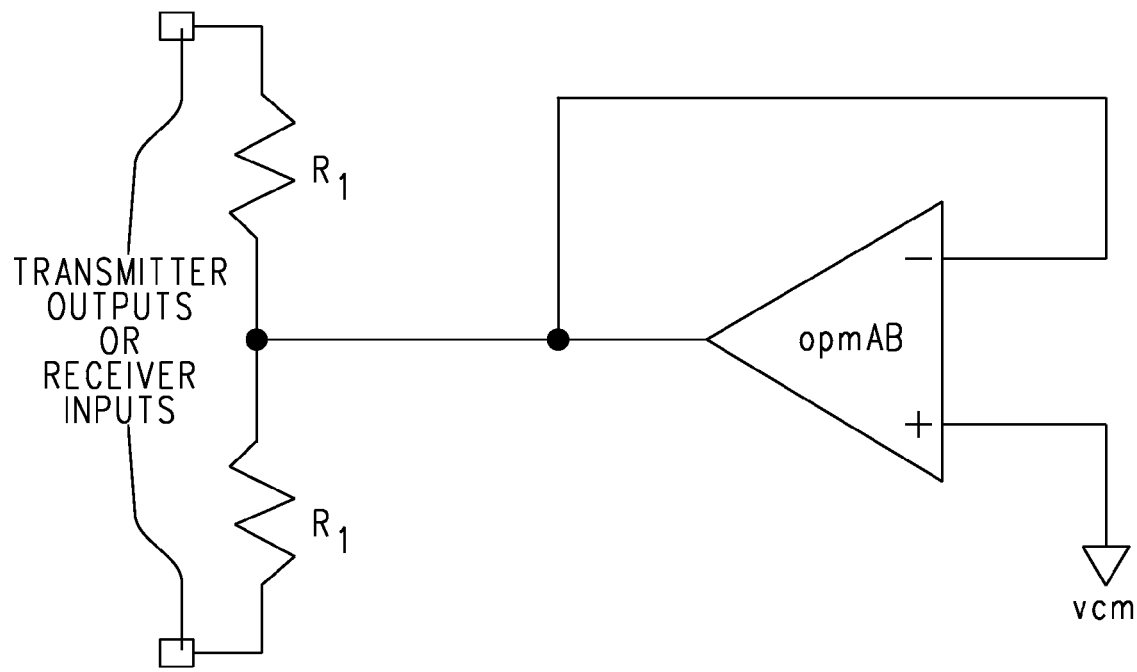
FIG. 19 shows an embodiment of a common mode rejection circuit.

One embodiment of such a CMR compensation circuit is shown in FIG. 19, where the common mode voltage of the transmitter outputs and receiver inputs is established by a resistor divider network driven by the common mode amplifier opmAB. In the embodiment illustrated in FIG. 19, amplifier opmAB is configured to provide unity gain feedback by driving the center tap of the resistor divider network to a common mode reference voltage, vcm. For correct operation of the system, vcm is preferably set within an operating supply range. Ideally, vcm should be set to the middle of the operating supply range for optimum signal swing at both the transmitter and receiver. Since the amplitude of the common mode current may be in the range of tens of milliamps (depending on the coupling capacitance across the isolator channel), the resistors RI, R2 are preferably of low impedance (e.g., 10 ohms or less) so that any voltage drop across the resistors during a common mode event does not cause the transmitter outputs and receiver inputs to exceed the operating supply range. (Note, however, that resistors having higher impedance are also contemplated, such as impedances of about 100 ohms or less, or about 250 ohms or less.) If the signal swing at either the transmitter or receiver is allowed to exceed the operating supply range, the data transmitted across the channel will be corrupted. Furthermore, the two resistors must be well matched so that any mismatch in their resistance does not translate into erroneous differential signals. Since the output stage of the common mode amplifier is typically designed to handle common mode currents up to a specified amount, ESD diodes may be placed at the transmitter outputs and receiver inputs to provide further protection to isolator 20 in case the common mode current is larger than the design specifications.

Figure 20A:
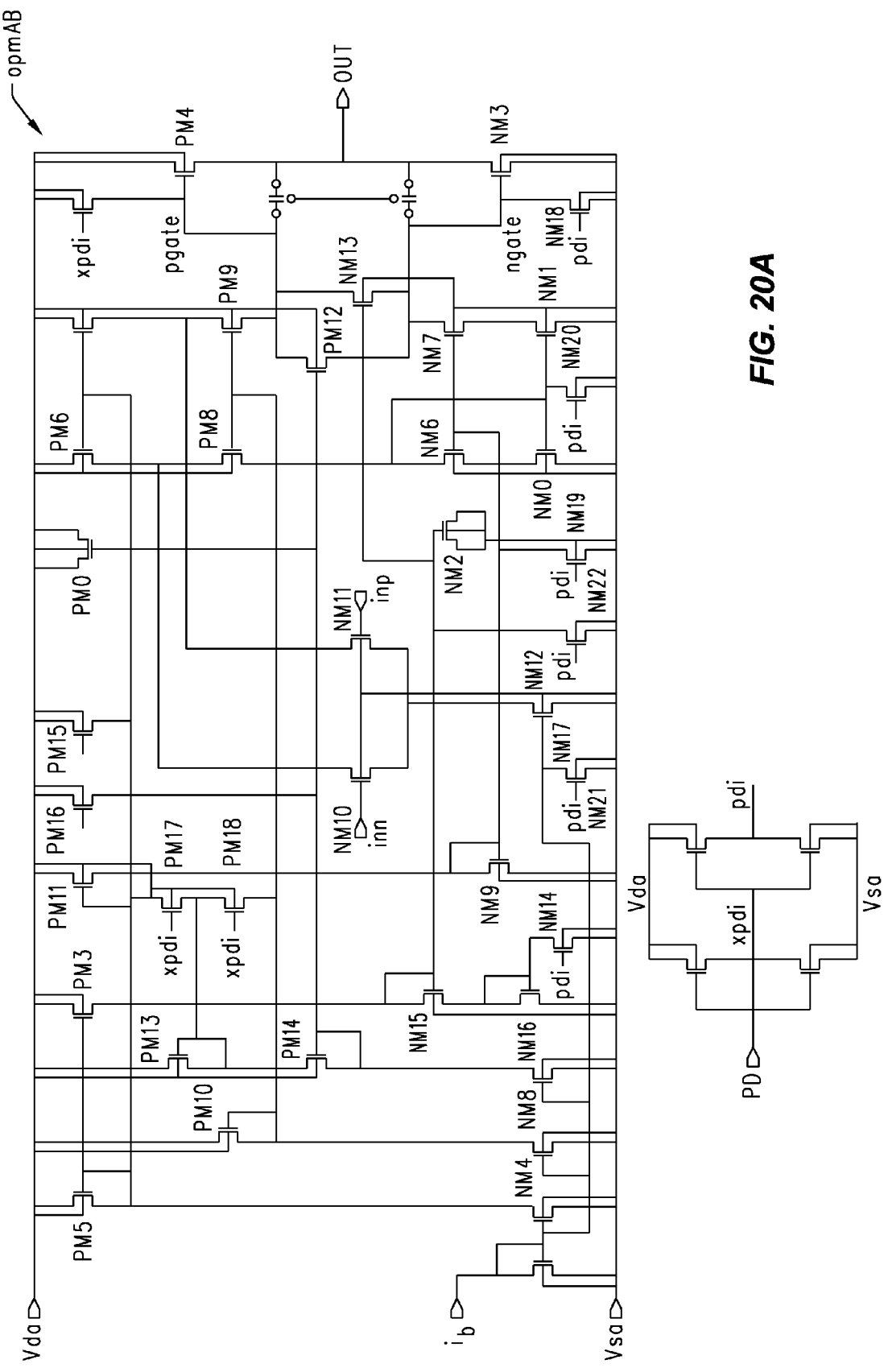
FIG. 20A is a detailed diagram of an embodiment of a two-stage common mode amplifier.

FIG. 20A shows details of one embodiment of two-stage Class AB common mode amplifier opmAB shown in FIG. 19. Amplifier opmAB is a common mode current compensation amplifier operably connected to both transmitter circuit 21 and receiver circuit 22. During a common mode event amplifier opmAB sinks or sources a common mode current that may easily drive the signal level to the plus or minus power supply value with a resulting loss of data signal through the isolation channel.

Continuing to refer to FIG. 20A, the left side of the amplifier structure is a bias system that is referenced to a bias current $i_b$. This bias current is generated in another part of the isolator 20. Bias voltages are generated in the left side of FIG. 20A. In one embodiment, the input to amplifier opmAB is a pair of NMOS devices which drive a folded cascode structure to the right of the input pair. Such a configuration is used to achieve high gain at a high impedance level connecting to the output stage. See also, for example, pages 752-756 of Paul R. Gray and Robert G. Meyer in "Analysis and Design of Analog Integrated Circuits", $2^{nd}$ edition, John Wiley and Sons, New York, 1984, where similar circuit topologies are discussed in more detail.

Figure 20B:
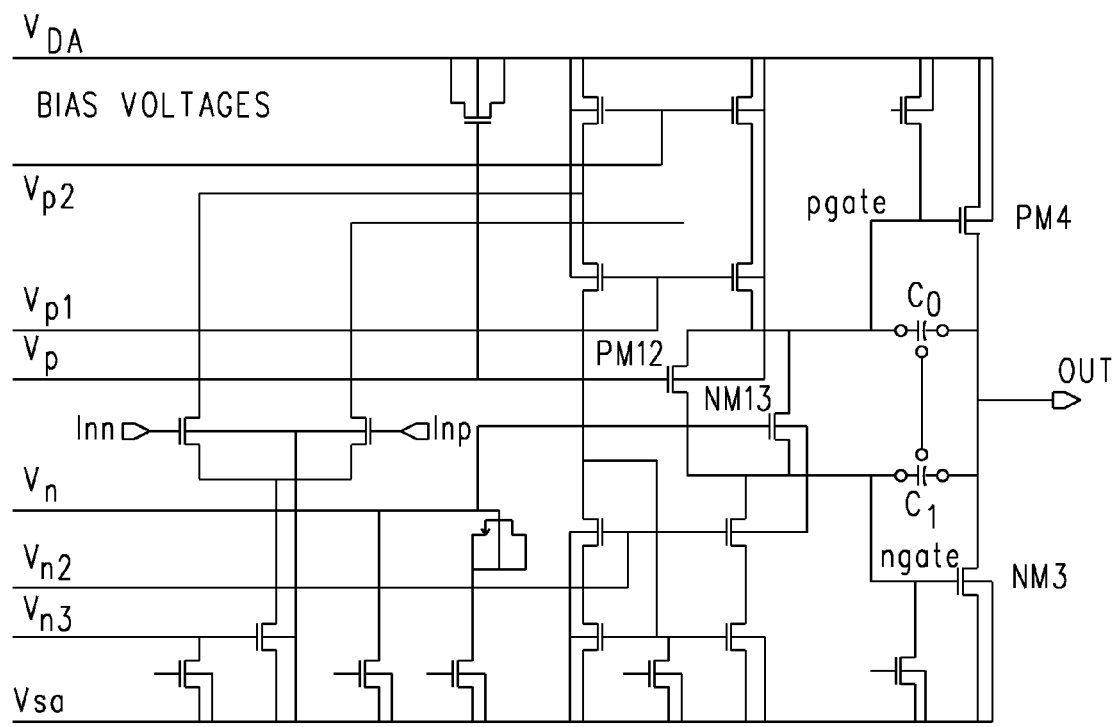
FIG. 20B shows a circuit configured to separate voltage levels between a gate drive for a PMOS output device and an NMOS output device.

FIG. 20B shows a circuit configured to separate voltage levels between a gate drive for PMOS output device PM4, and NMOS output device NM3. The circuit illustrated in FIG. 20B permits large output devices to be biased at a quiescent current level that is less than their full current sourcing or current sinking capabilities (i.e., class AB operation is achieved). The voltage difference between pgate and ngate signals is controlled by PM12 and NM13 devices. If there is a load on the output of the amplifier that requires sourcing or sinking larger amounts of current, either PM12 or NM13 may turn off since either the ngate value becomes higher than vn or the pgate value becomes lower than vp. The device that remains on keeps the first stage cascode structure in the proper operating region and keeps the output device on that does not have a heavy current demand with at least a minimal quiescent current level. PM12 and NM13 devices also have special AC signal properties. Gate bias levels vn and vp are bypassed by capacitors to ground. The two devices function as additional common gate stages that further boost the gain of the first stage at the input to the second stage, i.e., the output devices. An additional feature of this circuit arrangement is that the basic single pole type of roll off for the first stage circuit is preserved. The interface devices are unique since they provide a means of controlling the crossover characteristics for the class AB output stage, and add minimal delay and phase shift to the signals driving the output devices. As a result, the overall amplifier is easier to stabilize in respect of AC signals, and significant extra gain is provided by the amplifier circuit for the intermediate frequency region up to several megahertz.

Continuing to refer to FIG. 20B, the common mode output of the amplifier must be able to sink or source very heavy currents during a common mode transient event. The earlier description of common mode transients emphasizes the need for a very fast response to the sharp transients, and to keep the midpoint of the signal near 1.25 volts (or at the middle of the operating range according to one embodiment of the invention). Amplifier performance may also be enhanced through proper design and selection of output devices. To keep costs down, it may be preferred to fabricate the necessary devices in an integrated circuit process that is primarily digital in nature with a few additions for analog capability. If a special process such as BICMOS or a CMOS process with multiple types of device characteristics is required, the number of masking levels and consequently the cost of fabrication may rise to excessive levels. Such specials processes are not suitable for manufacturing a basic isolation part that is optimally sufficiently inexpensive to permit its use in low cost applications. The output device circuitry shown in some of the Figures hereof was selected to employ devices that are available in low-cost CMOS manufacturing processes but that are capable of achieving necessary performance characteristics through careful design.

Continuing to refer to FIG. 20B, to achieve the required fast response performance characteristics, isolator 20 must have a large Gm to increase the bandwidth thereof. It has been discovered that a fast response to fast transients may be achieved by using a very short feedback path (in respect of time delay) so that all or most of the transients may be suppressed. The device capabilities of the output devices for conventional CMOS processes are adequate to achieve this result if the feedback element is a capacitor from the output back to the gate of the output NMOS or PMOS device. This very short feedback path provides frequency response for correction of the common mode voltage up to about 2 GHz. Trying to achieve a correction response for the fast transient sensed at the output by using a feedback path through the first stage of the amplifier circuitry has been discovered not to be possible because of excessive time delays introduced thereby. Consequently, in a preferred embodiment the output stage uses local feedback at output devices PM4 and NM3 to accomplish fast transient suppression. Drain to gate capacitors C0 and C1 provide such fast response paths. Capacitors C0 and C1 also serve to stabilize the overall frequency response of the amplifier. There is some flexibility in the choice of capacitors C0 and C1 so the gain bandwidth of the amplifier structure is around 2 MHz. Another aspect of the operational amplifier design shown in FIG. 20B is the local feedback circuitry around output devices PM4 and NM3, which provides transient control. At the same time, the overall response of the amplifier is also relatively easily stabilized because of the first stage cascode architecture.

Many different types of coding schemes may be employed to transmit data signals through galvanic isolator 20 and coil transducer 39. For example, a sequence of two pulses may be employed to represent a rising transition on the user waveform and a single pulse to represent a down transition. (See, for example, "iCoupler Products with isoPower Technology:

Signal and Power Transfer Across Isolation Barrier Using Microtransformers" authored by Baoxing Chen and published by ADI Inc.) The embodiment described herein employs some aspects of the basic physics of the design and operation of isolator 20 and coil transducer 39 to provide a coding scheme that is relatively simple and capable of operating at a high data rate. Input transitions are converted to single pulses having polarities corresponding to positive-going or negative-going transitions in the input signal. Since there is only one pulse per input transition the maximum transmission frequency is limited by the size of the individual transmitted pulses, not by the extra time needed to create multiple same-polarity pulses for transmission. The differentiation action of the transformer in the isolation channel produces a multiple pulse output for the sequence of input pulses. According to one embodiment of receiver circuit 22, the sequence of pulses also may be checked to verify data integrity.

Figure 21:
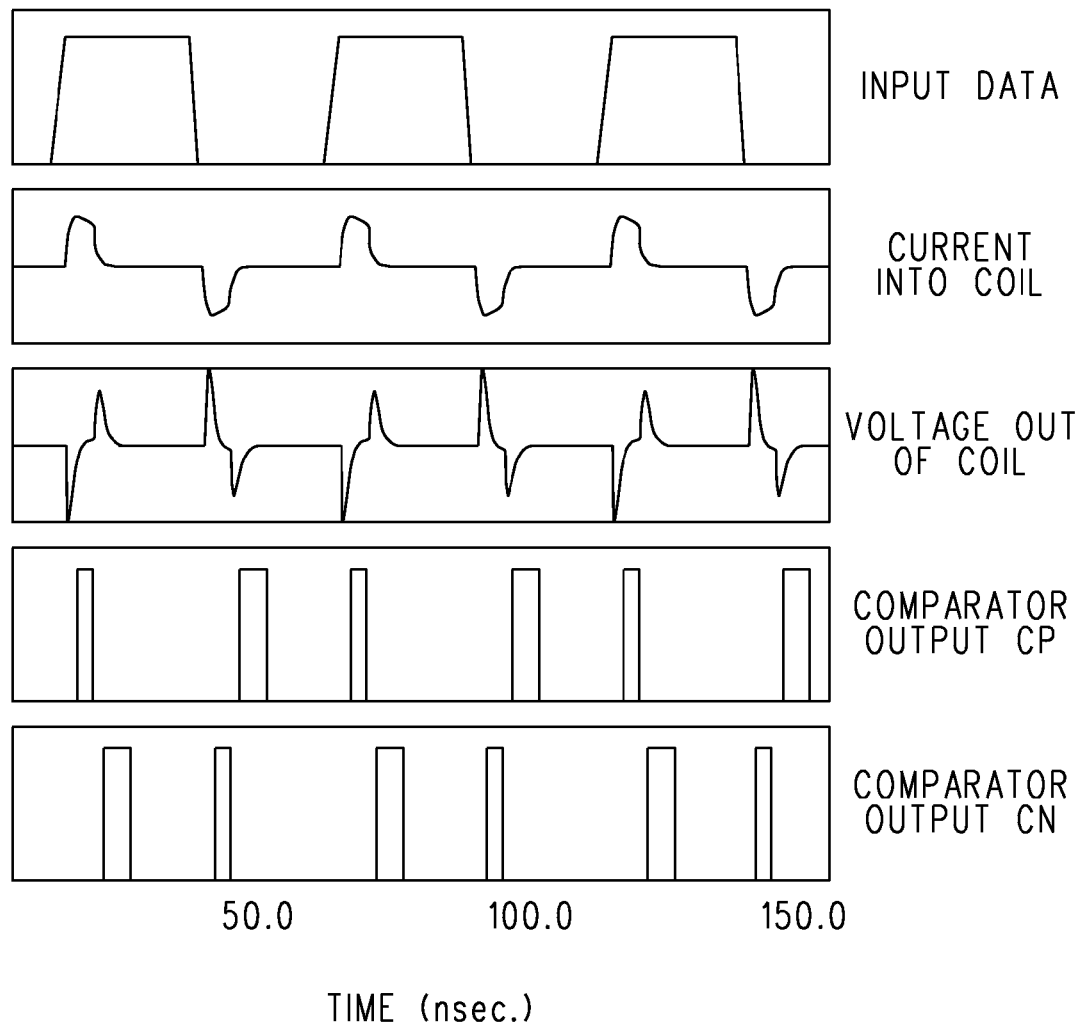
FIG. 21 shows a sequence of pulses as they are transmitted and received by various portions the circuitry disposed in one embodiment of galvanic isolator 20.

One possible pulse sequence is illustrated in FIG. 21. The information transfer through the isolation channel uses a sequence of pulses that is initiated by input signal transitions, converted to current pulses driving transmitter coil 23 in the transmitter, passed through coil transducer 39 and then differentiated as shown at receiver coil 24. The output voltage peaks are sensed and read by receiver circuit 22, and used to construct an output pulse sequence. To reconstruct the input waveform, comparator outputs are processed through a decoder that produces a positive- or negative-going edge on the rising edge of the second pulse in each sequence of pulse pairs provided to the comparator as positive and negative outputs.

The output of coil transducer 39 is shown in FIG. 21 as "Voltage Out of Coil." Due to the nature of the coil transducer 39, the primary input current pulses ("Input Data" in FIG. 21) are transformed into a sequence of pulses in the secondary output. FIG. 21 shows that "Voltage Out of Coil" signals occur in pulse pairs. A negative pulse is quickly followed by a positive pulse (or a positive pulse is followed by a negative pulse, according to the manner in which coil transducer 39 is wired and configured). In one embodiment, the second pulse in such paired pulses must occur within a short period of time after the first pulse has occurred (e.g., about 10 ns or a similar period of time) to be detected by receiver circuit 22 as a data pulse and not noise. In other words, if the second pulse of the paired pulses does not appear within a predetermined time window after the first of such pulses, then a lone pulse occurring outside the predetermined time window does not represent a valid data pulse, and the pulse will be blocked or ignored.

In addition, and continuing to refer to the "Voltage Out of Coil" signal in FIG. 21, in one embodiment an additional check on the accuracy of the pulses detected by receiver circuit 22 may be performed. A minus (−) pulse followed by a plus (+) pulse must be followed by a plus (+) pulse followed by a minus (−) pulse. (Alternatively, and according to the manner in which coil transducer 39 is wired and configured, a plus (+) pulse must be followed by a minus (−) pulse, which must be followed by a minus (−) pulse followed by a plus (+) pulse.) If such a sequence is not detected by receiver circuit 22, otherwise sensed signals cannot pass through the decoder since they do not represent valid data.

It will now be seen that the novel transmitter and receiver circuits of the invention provide certain advantages not found in prior art galvanic isolators configured to transfer data signals across a dielectric barrier. One such advantage is that the signaling scheme employed in transmitter circuit 21 and receiver circuit 22 is much simpler, more robust and exhibits superior CMR performance respecting prior art signaling methods employed in such devices. Receiver circuit 22 is able to handle excess current and distinguish real data signals from noise signals. Both such performance characteristics are required if high CMR performance is to be attained in the presence of interfering noise pulses. By way of comparison, see the relatively complicated data signal transfer schemes described in U.S. Patent Publication No. 2005/0057277 to Chen et al. entitled "Signal Isolators Using Micro-Transformers" dated Mar. 17, 2005 and U.S. Patent Publication No. 2005/0272378 to Dupuis entitled "Spread Spectrum Isolator" dated Dec. 8, 2005. It will be seen that the foregoing Chen and Dupuis references employ considerably more complicated data encoding and decoding schemes than those described herein.

Referring to FIG. 2, the receiver 22 may be configured to monitor differential signals transmitted across the isolator 20 and produce an output that is a minimally delayed version of the input signal provided to transmitter 21. Although the output of the receiver 22 is a delayed version of the input signal to the transmitter 21, it should nevertheless preserve the pulse width of the input signal so that signal integrity may be maintained. The common mode voltage of the receiver inputs may be set using the common mode schemes described above for transmitter common-mode signals.

Figure 22:
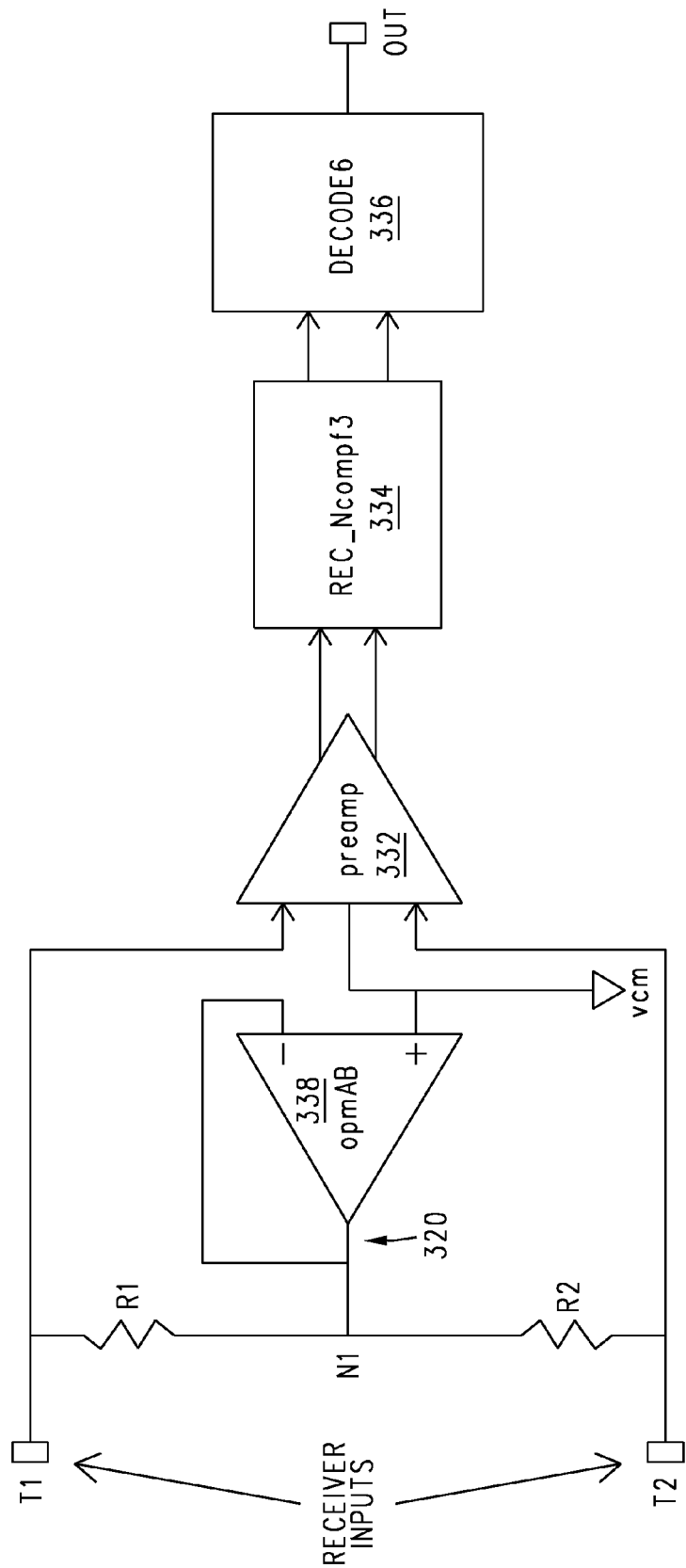
FIG. 22 is a block diagram of an embodiment of the receiver circuit 22 of FIG. 2.

A block diagram of an embodiment of the receiver 22 is shown in FIG. 22. In the embodiment of FIG. 22, the receiver 22 has clamping circuit 320 (sometimes referred to as a common mode holding circuit), a fully differential preamplifier 332, a fully differential high speed comparator 334, and a decoder stage 336 that reconstructs the received signals. The receiver 22 produces an accurate reproduction of the input signal provided to the galvanic isolator 20. The components of the receiver 22 are described in greater detail below.

The receiver coil 24 is connected to two terminals T1 and T2 in the receiver 22. Resistors R1 and R2 are connected in series between the terminals T1 and T2. The clamping circuit 320 includes a differential amplifier 338 and the two resistors, R1 and R2. The resistors R1 and R2 may each have values of about 25 ohms. The output of the amplifier 338 and the resistors R1, R1 are connected together at a node N1. The resistors R1 and R2 in combination with the amplifier 338 maintain the voltage at the node N1 at a preselected voltage. For example, in a 2.5 volt system, the node N1 may be maintained at approximately 1.25 volts.

Figure 23:
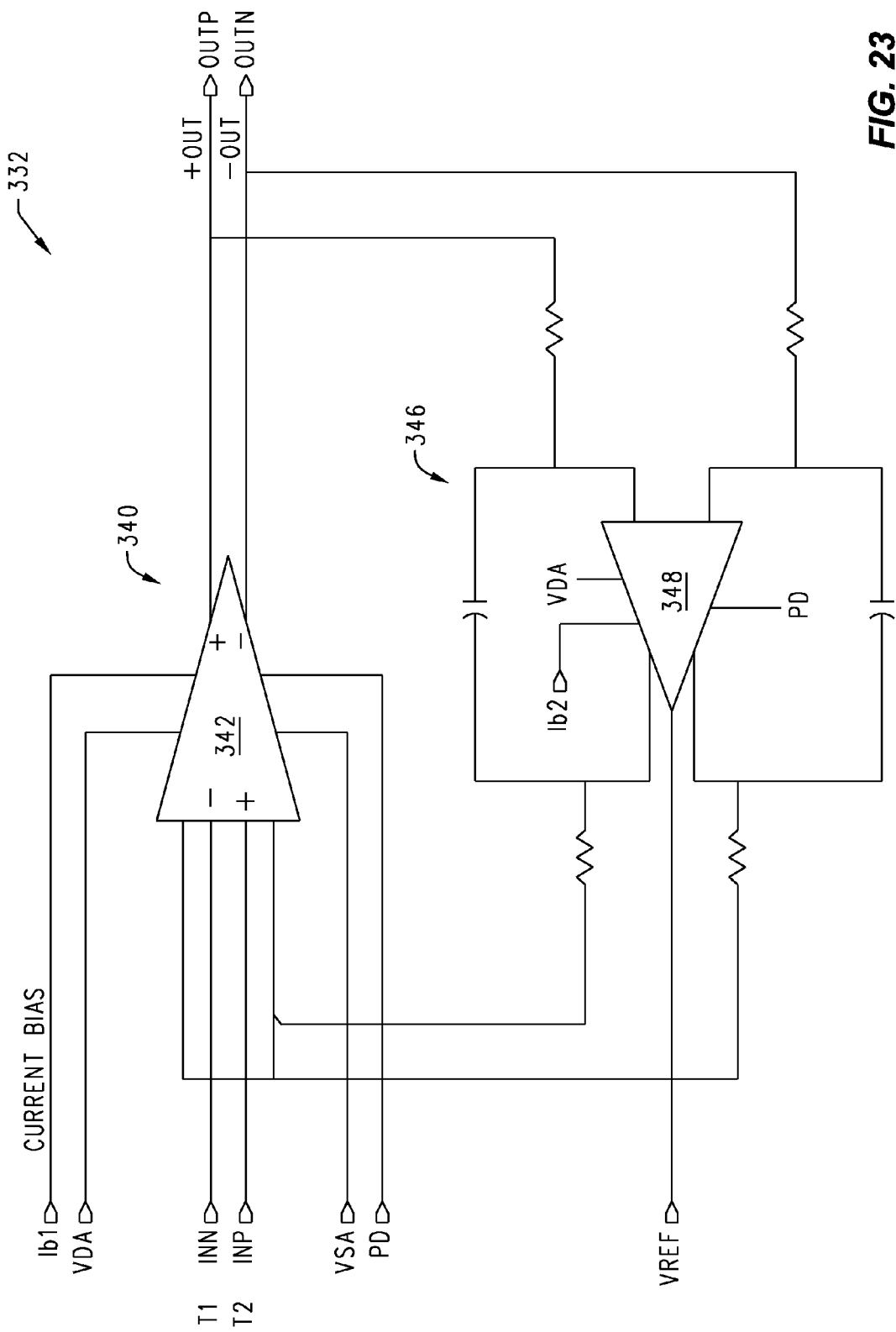
FIG. 23 is a schematic diagram of an embodiment of the preamplifier of FIG. 22.

An embodiment of a circuit 340 of the preamplifier 332 of FIG. 22 is shown in FIG. 23. In summary, the embodiment of the circuit 340 includes a high performance Cherry Hooper [Chris D. Holdenried, Michael W. Lynch, and James W. Haslett, "Modified CMOS Cherry-Hooper Amplifiers with Source Follower Feedback in 0.35 um technology," Proceedings of the 29th European Solid-State Circuits Conference, pp. 553-556, 2003] circuit topology to provide a gain of about 6 with about 1 GHz bandwidth.

The preamplifier 332 is optimized for fast signal performance. It provides some gain to the incoming signals so that the requirement on the resolution of the follow on comparator 334, FIG. 22, is relatively eased. The high bandwidth of the circuit 340 allows the narrow output pulses generated by the receiver coil 24 to pass through with minimal attenuation. As described above with regard to the transmitter 21, the multiple overlapping current pulses driving the transmitter coil 23 spread the transmit pulse energy over a longer period than the case if a single current pulse is used. The overlapping pulses enable optimization of the bandwidth of the receiver 22. In order to achieve high data rate throughput, the bandwidth of the preamplifier 332 must be higher than the bandwidth of signals being transmitted therethrough. It is noted that if the bandwidth is too high unnecessary power waste results and noise gets into the system. The bandwidth is also a physical factor limited by process capability and implementation cost. Hence, the bandwidth of the preamplifier 332 in embodiments described herein may be designed to be just sufficient for the system to achieve its desired data baud rate.

Furthermore, the possibility of residual common mode signals from the receiver coil 24 causing difficulties in the preamplifier 332 are reduced greatly by a low frequency offset correction amplifier driving a second set of inputs to the Cherry Hooper amplifier. The offset correction mechanism also provides DC balanced inputs to the follow on comparator.

The terminals T1 and T2 from the receiver coil 24 are input to the Cherry Hooper amplifier 342. It is noted that amplifiers other than a Cherry Hooper may be used herein. The terminals T1 and T2 provide a differential input to the amplifier 342. A low frequency integrator 346 provides feedback for the amplifier 342. In summary, the low frequency integrator 346 includes a differential amplifier 348 with capacitive feedback. The output of the low frequency integrator 346 provides the above-described offset correction into the amplifier 342.

Figure 24:
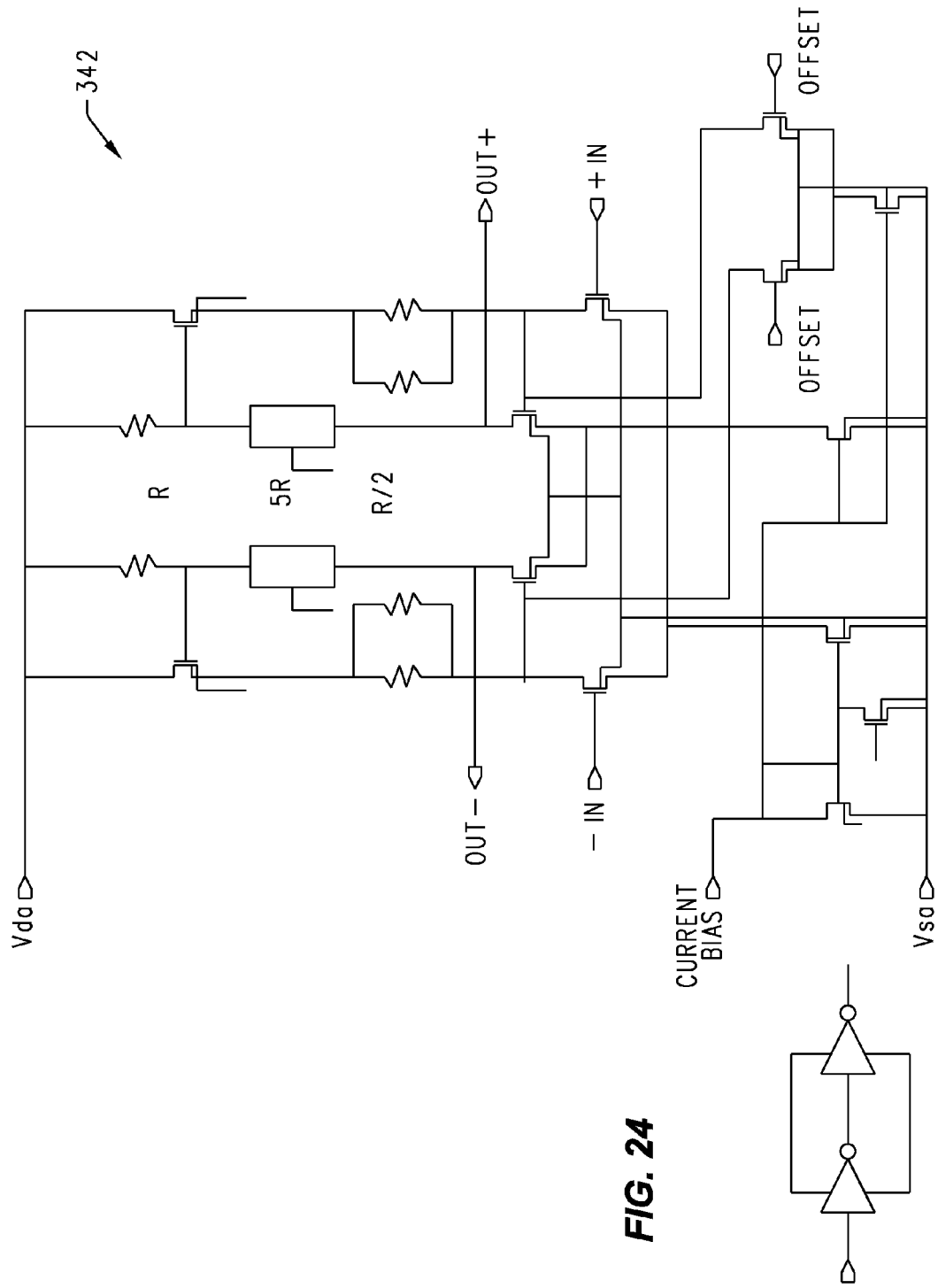
FIG. 24 is a schematic diagram of an embodiment of the amplifier of FIG. 23.

FIG. 24 is a schematic diagram of an embodiment of the amplifier 342 of FIG. 23. The amplifier 342 uses an NMOS design for the Cherry Hooper gain stage. The N devices are used because of better matching of the natural threshold devices and the relatively high gain, Gm, of the devices. This combination provides better high frequency common mode rejection when used with the low frequency feedback amplifier shown in FIG. 23. The amplifier 342 tolerates a significant common mode input range while providing a consistent output common mode level that is optimized for the follow on comparator circuit.

Figure 25:
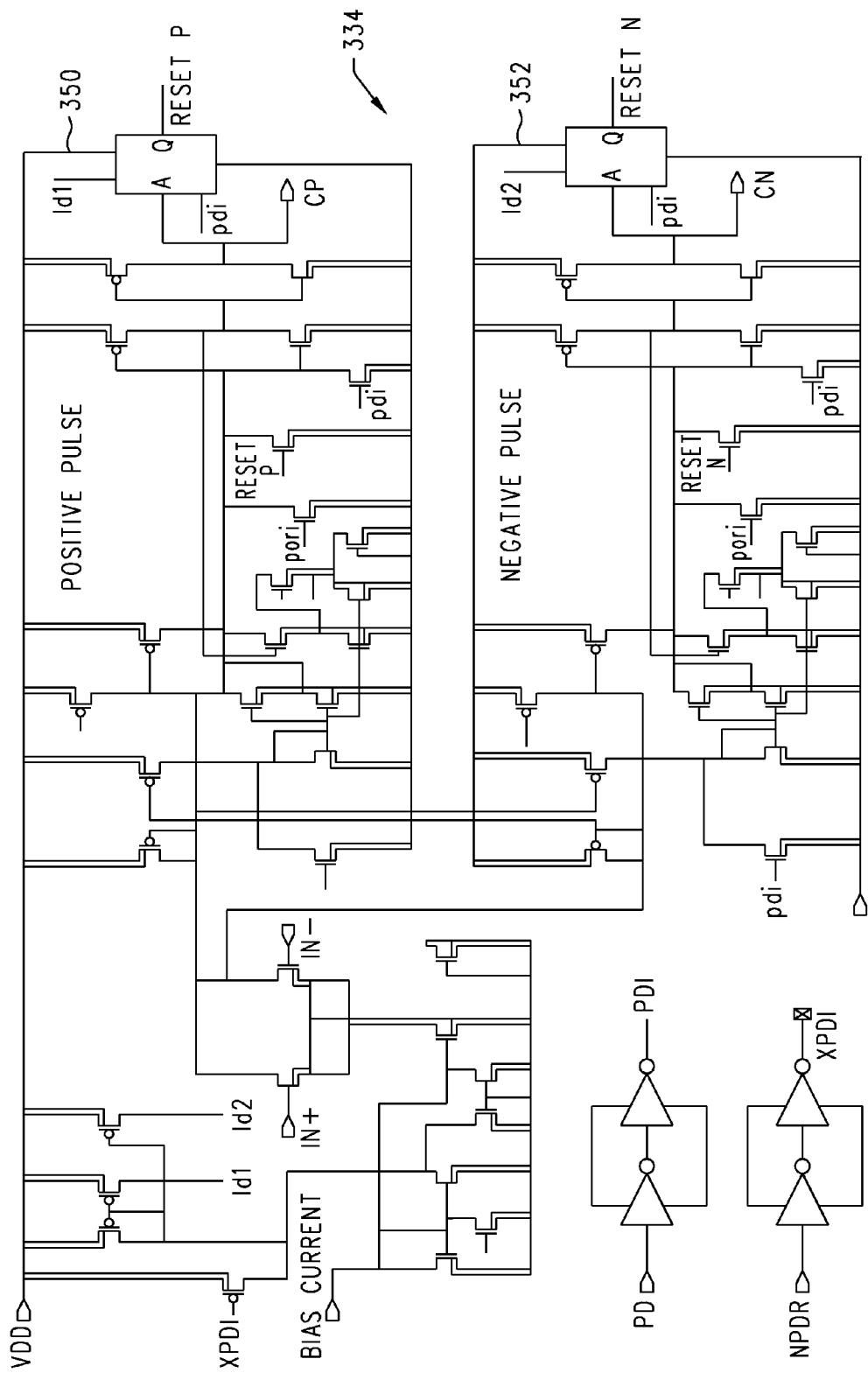
FIG. 25 is a schematic diagram of an embodiment of the comparator of FIG. 22.

FIG. 25 is a schematic diagram of an embodiment of the comparator 334 of FIG. 22. In the embodiment illustrated in FIG. 25, the comparator 334 has a fully differential design with current mirror load structures having a differential output gain of about 80. The fully differential design provides good common mode rejection which is important not only for noise rejection during normal operation, but also during a common mode event to ensure that common mode transients do not transform into differential signals and disrupt receiver operation.

The current mirror output structures have additional feedback from a follow on inverter stage to provide positive feedback for comparator operation with hysteresis. The threshold for the comparator is set at about 80 mV so as to be reasonably away from the noise level. The hysteresis window of about 30 mV further improves system noise immunity. There is additional gain after the comparator with another inverter stage. It is desirable to have uniform pulses of small but controlled width as input to the decoder circuit after the comparator. The fixed pulse widths are achieved by using controlled delay elements 350, 352 with 1.5 ns delay and a feedback line back to the first inverter stage to turn off the pulse after 1.5 ns.

Based on the foregoing, the input + and input − of the comparator 334 are coupled to the outputs out + and out − of the amplifier 342, FIG. 24. When the input voltages exceed 80 mV, or other values set by the design of the comparator 334, from a threshold voltage, a pulse is generated at the respective outputs CP and CN. A hysteresis is used, which in this embodiment is 30 mV. The output pulse triggers the delay circuits 350, 352, which reset the outputs CP and CN after a preselected period. In the embodiment of FIG. 25, the preselected period is approximately 1.5 ns. Thus, the maximum pulse width generated by the comparator 334 is 1.5 ns.

Figure 26:
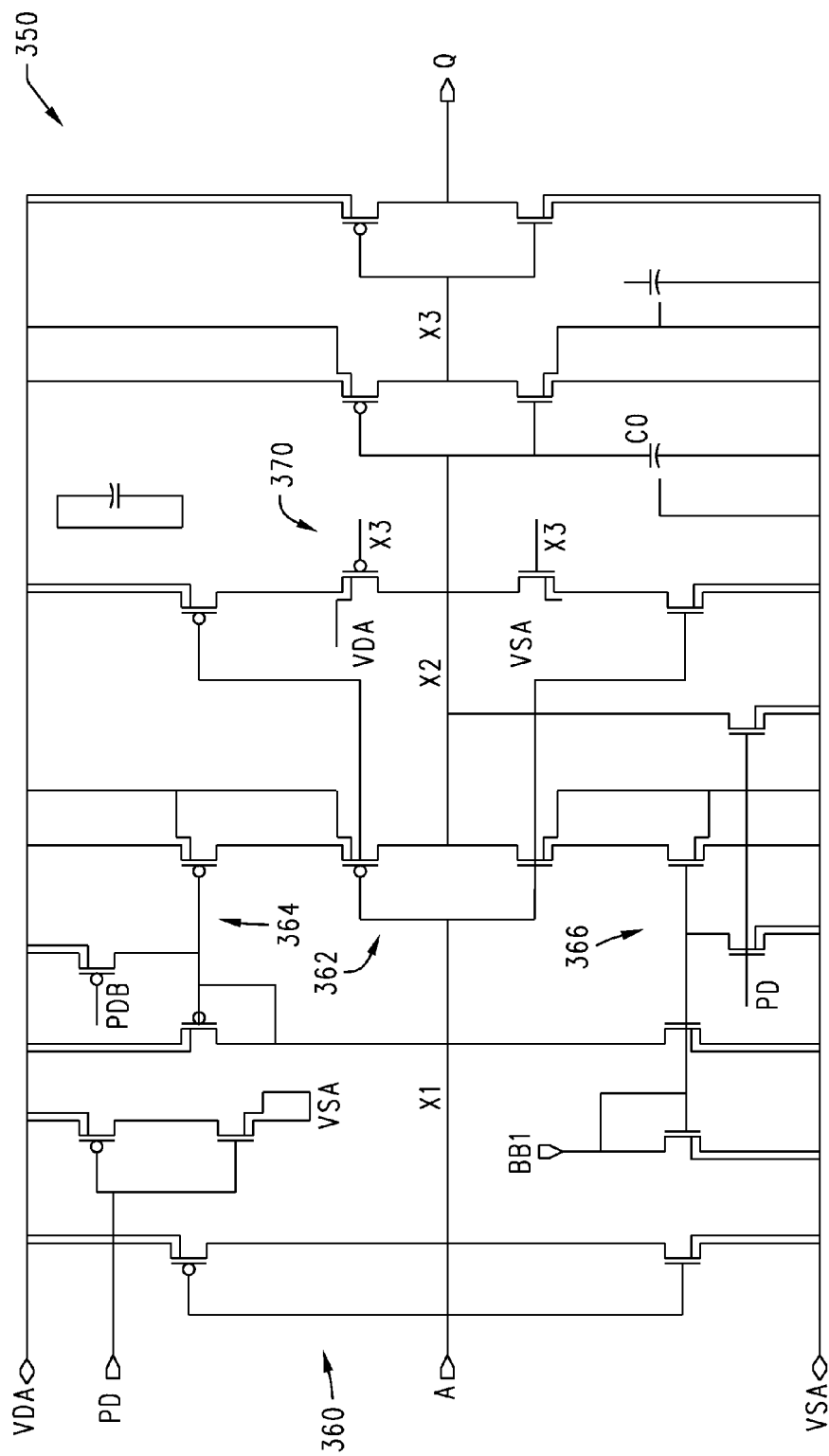
FIG. 26 is a schematic illustration of an embodiment of a delay element of FIG. 25.

FIG. 26 is a schematic illustration of an embodiment of one of the controlled delay elements 350, 352 of FIG. 25. The delay element 350 has an initial inverter stage 360 followed by a bias current controlled inverter 362 between the nodes X1 and X2. The center two devices in the current controlled inverter 362 act as a regular inverter stage with the amount of current used during the transitions controlled by the top and bottom current source devices 364, 366.

A capacitor C0 is connected between VSA and node X2. The timing from node X1 to node X2 is primarily controlled by a combination of the bias current value coming into node BB1 and the capacitor value C0 that is attached to node X2. There are two follow on inverter stages 370 to reduce output loading effects on node X2. The string of 4 devices in the inverter stages 370 includes two center devices connected to node X2 and the gates of the two center devices connected to node X3 is a non-retriggering prevention circuit. Once the delay generation sequence has started these devices force the completion of the delay time before the timing of a follow on event can start. In effect, the mechanism is a filter blocking very fast repeated input pulses. Temperature, process, and supply voltage variations can cause significant variations in the delay values of inverter strings. The delay elements are designed to be symmetrical in delay for a positive going input edge and a negative going input edge.

The bias current is used as a temperature compensation mechanism. As temperature increases the inherent delay in the delay element 350 will increase due to the TC of the devices. The bias current provided external to the delay element 350 is designed with a positive TC so as temperature increases the delay will stay constant. The determination of the delay by a combination of the bias current and the capacitor C0 on node X2 also reduces the susceptibility to process variations. Supply voltage variation is primarily reduced by operation of the delay elements along with the core of the transmitter and receiver circuits on an internally regulated supply voltage.

There is secondary supply rejection designed into the delay element 350. This embodiment of the delay elements is used in both the transmitter and receiver chips in the isolator 20.

Figure 27:
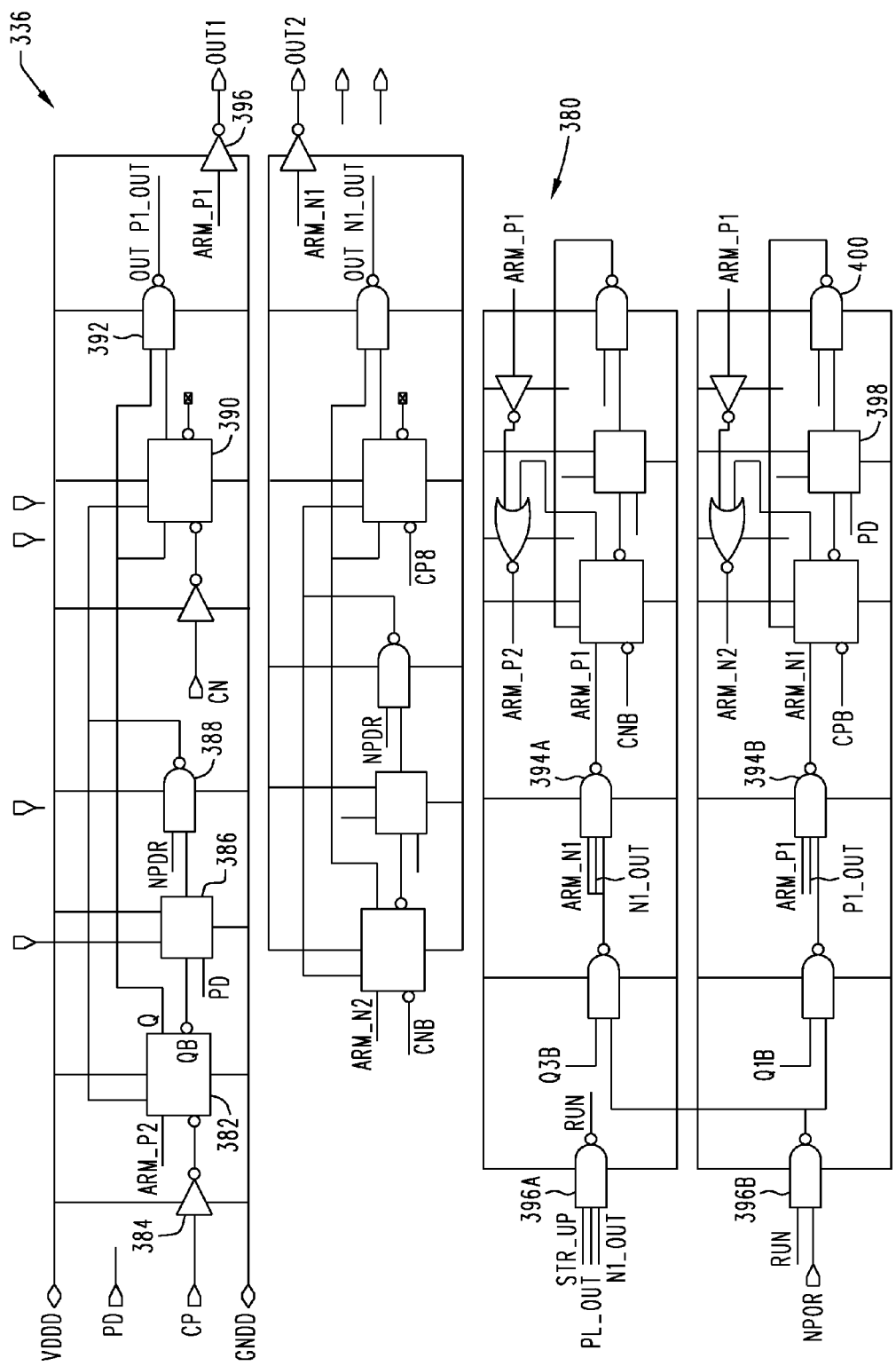
FIG. 27 is a schematic illustration of an embodiment of the decoder of FIG. 22.

FIG. 27 is schematic illustration of an embodiment of the decoder 336 of FIG. 22. The decoder 336 receives inputs from the comparator and, based on these inputs, reconstructs the original data signal input to the isolator 20. The decoder 336 receives inputs CP and CN from the comparator 334. As described above, the preamplifier 332 and the comparator 334 turn the pairs of negative going pulses followed by positive going pulses or the alternative sequence into short pulses. In the embodiment described herein, the pulses are approximately 1.5 ns long with characteristic spacing between the pairs of pulses representing either of the two sequences.

There are two outputs, CP and CN, from the comparator 334. The output CP represents positive pulses that have been received and the output CN represents negative pulses that have been received. The decoder 336 needs to determine which pairs of pulses represent a valid input positive transition to the isolator 20 and which pairs represent a valid input negative transition. Invalid detections need to be discarded by the decoder 336.

The information to determine whether a given pulse pair is a valid representation of a transition is contained in the timing. If two pulses are a valid pulse pair several criterion must be met. The time between the initial pulse and the follow on pulse must be less than a preselected value T1. A period longer than T1 indicates that there was either a false detection of a first edge or that the second edge of the pulse was not detected. The timing requirement may be implemented fairly precisely since the same type of controlled delay structure is used in both the transmitter 21 and receiver 22.

Another test for a valid pulse pair determines whether the pulses alternate. For example, a CP should be followed by a CN and visa versa. If the pulse pairs are not received, an error has occurred. In some embodiments, the decoder 336 will observe invalid alternation sequences and ignore them until a proper pair is received.

The embodiment of the circuit 380 is divided into 4 rows of logic elements and controlled delay elements. The first row and second row check for valid pulse pair sequences. With regard to the first row, the CP pulse is used to clock a first flip flop 382 which follows an inverter 384. The first flip flop 382 may be a D flip flop. The D input for flip flop 382, ARM_P2, is at the appropriate level so the first flip flop may be activated. This activation produces a positive transition on the flip flop Q output and a negative transition on the QB output. The QB output triggers a controlled delay element 386. There is no output from the controlled delay element 386 for a time duration T1, wherein T1 is 6 ns. After T1 has occurred, a negative transition occurs on QB which feeds back through a NAND gate 388 to reset the first flip flop 382. During the T1 duration the Q output of the first flip flop 382 is in a state that will enable the D input of a second flip flop 390. If the CN pulse from the comparator 334 occurs during the time T1 the second flip flop 390 will also change state, i.e. the Q output will have a positive transition. A NAND gate 392 produces a negative going pulse indicating a valid pulse pair has been received.

The pulse generated by the NAND gate 392 does not go directly to the output, but instead goes to the 4th row of the circuit 380 to determine if the pulses alternate. The first 3 gates of row 3 and row 4 of the circuit 380 are state RS flip flops that keep track of which type of pulse pair is required next. The first gates 396A (row 3) and 396B (row 4) is active only during initial power on. The objective is to put the system into a known state at power up so the decoder 336 will operate properly for subsequent inputs. The third logic gate 394 in row 4 is one half of an arm state flip flop, composed of gate 394B and gate 394A, the gate directly above it. This flip flop 394 does the set up for the alternation of pulse sequences test. The P1_OUT pulse generated by the row 1 circuitry changes the state of the RS arm flip flop 394 so that ARM_N1 becomes active. The next pulse pair expected is a CN pulse followed by a CP pulse. The ARM_N1 signal passes through some additional circuitry in row 4 and emerges as ARM_N2 as described below. This signal is used to arm the circuitry in row 2 so the CN pulse followed by CP pulse combination is ready to be detected by row 2.

At the same time the arm flip flop 394A,B changes state, the ARM_P1 signal goes to the last inverter 396 in row 1 which generates the OUT1 signal for the decoder. In this case, the output is a positive transition.

The row 2 circuits operate in an analogous manner to the row 1 circuits for the CN followed by CP pulse pair sequence. When a valid CN CP pulse pair has passed through the row 2 circuitry, the arm state flip flop will change state, causing a positive transition on the ARM_P1 signal, which in turn causes OUT1 to have a negative transition. Therefore, the positive transition followed by a negative transition on OUT1 will follow the user input which is the desired result. The second output OUT2 is the inverse of OUT1 and is provided as an optional output.

The D flip flops, delay elements and gates in the remaining circuitry in row 3 and row 4 are inhibit circuits for the cases of repeated CP CN pulse pairs or repeated CN CP pulse pairs. For illustration purposes a valid CP followed by a CN has occurred. The result is ARM_N1 is in the active state and a CN followed by a CP pulse is expected to occur next. Instead a CP pulse followed by a CN pulse occurs. The ARM_P1 signal is in the non active state, so the CP pulse will not do anything to the row 1 circuits. However, the second half of the sequence is a CN pulse which might activate the circuitry in row 2. This situation has a small potential to cause confusion in the decoder 336 if the system is operating near the maximum signal speed. A method to eliminate ambiguity is to acknowledge that a repeat CP pulse did occur and use it to inhibit the follow on CN pulse that would occur if this is a repeat CP CN pulse pair. The arm signal that actually is connected to row 2 is the ARM_N2 signal from the fourth row of circuitry. The ARM_N1 signal activates a D flip flop which triggers a 2.5 ns delay element 398 which in combination with a NAND gate 400 produces a ARM_NQ signal for duration T0, 2.5 ns, which inhibits the ARM_N2 signal from going into the active state when the CN pulse in the CP CN pair would be present. This inhibit circuitry is in the later part of row 4. There is similar inhibit circuitry in row 3 for the case of repeated CN CP pairs.

As the transformer only transmits AC or oscillatory signal information across the channel, a DC refresh circuit is preferably included in the system to ensure correct DC levels when no transitions are present in the data signals being transmitted. In one embodiment, the DC refresh circuit comprises a watchdog timer disposed in transmitter circuit 21 that is configured to monitor input signal transitions. If no signal transition occurs after a certain predetermined or programmed timeout or period of time, the watchdog circuit will initiate internal "keep-alive" pulses to keep the channel active so that the output DC state is maintained. On the other hand, a watchdog circuit may also be included in receiver circuit 22 to monitor signal transitions at the receiver inputs. If no signal transition occurs after a certain predetermined or programmed timeout or period of time, which is usually longer than the timeout of the transmitter watchdog, the receiver watchdog circuit will set the output to a default state. In one embodiment, the "keep-alive" pulses utilize a double edge encoding scheme. For example, the refresh for a high level is a 1 to 0, followed by a 0 to 1. The refresh for a low level is a 0 to 1, followed by a 1 to 0. The internal "keep-alive" pulses travel through the same channel as the external input signal so there is no need for a separate refresh channel. Such "keep-alive" pulses may eventually be filtered by receiver circuit 22 and not appear at the final output.

Note that the terms "vertical" and "horizontal" employed herein are intended to refer to the relative orientations of capacitor planes as they relate to underlying or overlying ground plane substrates 60. Thus, while a device made in accordance with the teachings of the invention might, in fact, have co-planar digital data communication electrodes disposed in a single plane, and the single plane is vertically oriented but is parallel or substantially parallel to the ground plane substrate, such a device would nevertheless fall within the scope of the invention.

Note also that according to one embodiment of the invention, a first substrate is provided atop which first and second coils 23 and 24 are disposed with an intervening dielectric barrier or second substrate disposed therebetween. In such an embodiment, therefore, the first substrate is positioned beneath both the transmitter coil 23 and the receiver coil 24, where the coils and the second substrate are fabricated on top of the first substrate.

Note further that included within the scope of the present invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A galvanic isolator, comprising:
   a generally planar electrically insulating substrate comprising opposing first and second surfaces, the substrate comprising an electrically insulating, low dielectric loss material and having a transmitter coil disposed on the first surface and a receiving coil disposed on the second surface;
   a transmitter circuit operably connected to the transmitter coil, said transmitter circuit comprising:
      a first detector that detects a rising edge of an input signal;
      a first pulse generator that generates a plurality of first pulses upon detection of said rising edge;
      a second detector that detects a falling edge of said input signal;
      a second pulse generator that generates a plurality of second pulses upon detection of said falling edge;
   a receiver circuit operably connected to the second receiving coil;
   wherein said receiver circuit generates a signal that is substantially similar to said input signal based on said first pulses and said second pulses.

2. The galvanic isolator of claim 1, wherein at least one of said first pulses overlaps at least a second one of said first pulses.

3. The galvanic isolator of claim 1, wherein the current generated by said first pulse generator remains substantially constant during generation of said first pulses.

4. The galvanic isolator of claim 1, wherein said input signal has a pulse length and wherein said first pulses are generated in a time that is less than half of said pulse length.

5. The galvanic isolator of claim 1 wherein said first edge detector generates a signal that enables said first pulse generator for a period that said first generator generates said first pulses.

6. The galvanic isolator of claim 1, wherein said first pulse generator comprises a plurality of delay circuits connected in series wherein a first of one of said delay circuits triggers a second one of said delay circuits.

7. The galvanic isolator of claim 6, wherein at least one of said delay circuits comprises two inverters connected in series.

8. The galvanic isolator of claim 1 and further comprising at least one driver connected between said first pulse generator and said transmitter coil.

9. The galvanic isolator of claim 8, wherein said at least one driver comprises at least one current mirror.

10. The galvanic isolator of claim 1 and further comprising a plurality of drivers, each of said plurality of drivers having an input and an output, the inputs of said drivers being connected to said pulse generators, the outputs of said drivers being connected in parallel and to said transmitter coil.

11. The galvanic isolator of claim 1, wherein said transmitter coil has a peak transmission frequency associated therewith and wherein said the spectrum of said pulses are substantially matched to said peak transmission frequency.

12. The galvanic isolator of claim 1, wherein the spectral components of said pulses are within the transmission bandwidth of said transmitter coil.

13. The galvanic isolator of claim 1, wherein the configuration of said transmitter coil is substantially similar to the configuration of said receiver coil.

14. The galvanic isolator of claim 1, wherein said transmitter coil is located on two metal layers connected by a first via, said first via having a first pad and a second pad associated therewith, wherein said first pad is located on a first metal layer and wherein a second pad is located on a second metal layer and wherein the portion of said transmitter coil located on said first metal layer has approximately $2\frac{3}{8}$ turns of traces comprising said transmitter coil.

15. The galvanic isolator of claim 14, and further comprising:
   a second via, said second via having a third pad associated therewith;
   a first segment that is a mutual tangent segment extending between the circumference of said first pad and the circumference of said third pad chosen so that said first pad and said third pad lie on the same side of the segment; and
   a second segment extending along at least a portion of a substantially straight trace, said substantially straight trace being located most proximate said first segment relative to other traces;
   wherein the shortest distance between said first segment and said second segment is approximately 35 um.

16. The galvanic isolator of claim 1, and further comprising a first via and a second via, said first via having a first pad associated therewith, said second via has a third pad associated therewith, the shortest distance between the circumference of said first pad and the circumference of said third pad being approximately 35 um when viewed perpendicular to said galvanic isolator.

17. The galvanic isolator of claim 1, wherein said transmitter coil has a via pad associated therewith and wherein the diameter of said first pad is approximately 150 um.

18. The galvanic isolator of claim 1, wherein said transmitter coil has at least one trace associated therewith and wherein the width of said at least one trace approximately 35 um.

19. The galvanic isolator of claim 1, wherein said receiver comprises devices to check the validity of signals received from said receiver coil.

20. The galvanic isolator of claim 1, wherein said receiver is connected to a voltage clamping circuit.

21. The galvanic isolator of claim 1, wherein said receiver comprises devices to distinguish between the transmission of leading edges and trailing edges on said input signal.

22. The galvanic isolator of claim 1 wherein said receiver coil is coupled to an amplifier, wherein the input to said amplifier has a DC bias voltage applied thereto, wherein said DC bias voltage varies, and where said DC bias voltage is corrected to maintain a DC voltage at the output of said amplifier.

* * * * *